United States Patent
Friend et al.

(10) Patent No.: US 8,546,791 B2
(45) Date of Patent: Oct. 1, 2013

(54) ELECTRO-OPTIC DIODE DEVICES

(75) Inventors: Richard Henry Friend, Cambridge (GB); Dinesh Kabra, Cambridge (GB); Bernard Wenger, Chaumont (CH); Henry Snaith, Abingdon (GB); Myoung Hoon Song, Ulsan (KR)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 12/999,614

(22) PCT Filed: Jun. 18, 2009

(86) PCT No.: PCT/EP2009/057637
§ 371 (c)(1),
(2), (4) Date: Feb. 11, 2011

(87) PCT Pub. No.: WO2009/153328
PCT Pub. Date: Dec. 23, 2009

(65) Prior Publication Data
US 2011/0140091 A1    Jun. 16, 2011

(30) Foreign Application Priority Data
Jun. 18, 2008   (GB) .................................. 0811199.9

(51) Int. Cl.
*H01L 21/24*    (2006.01)

(52) U.S. Cl.
USPC ........ 257/40; 257/98; 257/101; 257/E51.027; 438/82; 438/99

(58) Field of Classification Search
USPC ............... 257/40, E51.027, 98, 101; 438/82, 438/99
See application file for complete search history.

(56) References Cited

U.S. PATENT DOCUMENTS

| | | | |
|---|---|---|---|
| 5,670,791 A | 9/1997 | Halls et al. | |
| 5,989,738 A * | 11/1999 | Haase et al. | 428/690 |
| 2004/0084080 A1 * | 5/2004 | Sager et al. | 136/263 |
| 2006/0049419 A1 * | 3/2006 | Tanaka et al. | 257/98 |

OTHER PUBLICATIONS

Wikipedia Web document about Zinc Oxide Dated Oct. 10, 2012 ( 11 pages ).*
Aziz et al., "Degradation processes at the cathode/organic interface in organic light emitting devices with Mg:Ag cathodes", *Applied Physics Letters*, 72:2642-2644 (1998).
Barker et al., "Modeling the current-voltage characteristics of bilayer polymer photovoltaic devices", *Physical Review*, 67:075205-1-9 (2003).
Bolink et al., "Air stable hybrid organic-inorganic light emitting diodes using ZnO as the cathode", *Applied Physics Letters*, 91:22350-1-3 (2007).

(Continued)

*Primary Examiner* — Thinh T Nguyen
(74) *Attorney, Agent, or Firm* — Marshall, Gerstein & Borun LLP

(57) ABSTRACT

A light emissive or photovoltaic device comprising: a cathode structure for injecting electrons, the cathode structure having one or more constituent regions; an anode structure for injecting holes, the anode structure having one or more constituent regions; and an organic light emissive component located between the anode structure and the cathode structure; the refractive indices and the thicknesses of the or each constituent region of the cathode and anode structures and of the light emissive component being such that the emission or absorption spectrum of the device is substantially angularly dependent.

20 Claims, 16 Drawing Sheets a b c d

(56) References Cited

OTHER PUBLICATIONS

Burroughes et al., "Light-emitting diodes based on conjugated polymers", *Nature*, 47:539-541 (1990).
Donley et al., "Effects of Packing Structure on the Optoelectronic and Charge Transport Properties in Poly(9,9-di-*n*-octylfluorene-*alt*-benzothiadiazole)", *J. Am. Chem. Soc.*, 127:12890-12899 (2005).
Friend et al., "Electroluminescence in conjugated polymers", *Nature*, 397:121-128 (1999).
Greenham et al., "Angular Dependence of the Emission from a Conjugated Polymer Light-Emitting Diode: Implications for Efficiency Calculations", *Advanced Materials*, 6:491-494 (1994).
Gunes et al., "Conjugated Polymer-Based Organic Solar Cells", *Chem Rev.*, 107:1324-1338 (2007).
Haque et al., "A Multilayered Polymer Light-Emitting Diode Using a Nanocrystalline Metal-Oxide Film as a Charge-Injection Electrode", *Advanced* Materials, 19:683-687 (2007).
Kabra et al., "Semiconducting-polymer-based position-sensitive detectors", *Applied Physics Letters*, 85:5073-5075 (2004).
Kavan et al., "Highly Efficient Semiconducting $TiO_2$ Pholoelectrodes Prepared by Aerosol Pyrolysis", *Electrochimica Acta*, 40:643-652 (1995).
Kim et al., "Electroluminescence emission pattern of organic light-emitting diodes: Implications for device efficiency calculations", *Journal of Applied Physics*, 88:1073-1081(2000).
Kim et al., "Phase Separation in Polyfluorene-Based Conjugated Polymer Blends: Lateral and Vertical Analysis of Blend Spin-Cast Thin Films", *Macromolecules*, 37:2861-2871 (2004).
Kim et al., "Spin-cast thin semiconducting polymer interlayer for improving device efficiency of polymer light-emitting diodes", *Applied Physics Letters*, 87:023506-1-3 (2005).
Kumar et al., "Effect of fluorine doping on structural, electrical and optical properties of ZnO thin films" *Materials Science and Engineering*, 117:307-312 (2005).
Lee et al., "Air-Stable Polymer Electronic Devices", *Advanced Materials*, 19:2445-2449 (2007).
Li et al., "High-efficiency solution processable polymer photovoltaic cells by self-organization of polymer blends", *Nature Materials*, 4:864-868 (2005).
Liu et al., "Device performance and polymer morphology in polymer light emitting diodes: the control of device electrical properties and metal/polymer contact", *Journal of Applied Physics*, 88:605-609 (2000).
McElvain et al., "Formation and growth of black spots in organic light-emitting diodes", *J. Appl. Phys.*, 80:6002-6007 (1996).
Morii et al., "Encapsulation-free hybrid organic-inorganic light-emitting diodes", *Applied Physics Letters*, 89:183510-1-3 (2006).
Morteani et al., "Barrier-Free electron-Hole Capture in Polymer Blend Heterojunction Light-Emitting Diodes", *Advanced Materials*, 15:1708-1712 (2003).
Muccini, "A bright future for organic field-effect transistors", *Nature Materials*, 5:605--613 (2006).
Olson et al., "Hybrid photovoltaic devices of polymer and ZnO nanofiber composites", *Thin Solid Films*, 496:26-29 2006).
Plank et al., "A simple low temperature synthesis route for ZnO-MgO core-shell nanowires", *Nanotechnology*, 19:1-8 (2008).
Snaith et al., "Light intensity, temperature, and thickness dependence of the open-circuit voltage in solid-state dye-sensitized solar cells", *Physical Review*, 74:045306-1-6 (2006).
Studenikin et al., "Carrier mobility and density contributions to photoconductivity translients in polycrystalline ZnO films", *Journal of Applied Physics*, 87:2413-242 (2000).
Tokito et al., "Metal oxides as a hole-injecting layer for an organic electroluminescent device", *J. Phys D. Appl. Phys.*, 29:2750-2753 (1996).
Wander et al., "Stability of Polar Oxide Surfaces", *Physical Review Letters*, 86:3811-3814 (2001).
Xia et al., "Controlled Phase Separation of Polyfluorene Blends via Inkjet Printing", *Macromolecules*, 38:6466-6471 (2005).
Xia et al., "Phase Separation of Polyfluorene-Based Blend Films and Its Influence on Device Operations", *Advanced Materials*, 18:1371-1376 (2006).
International Search Report and Written Opinion for PCT/EP2009/057637 dated Sep. 16, 2009.
Wu et al., "Surface Modification of Indium Tin Oxide by Plasma Treatment: An Effective Method to Improve the Efficiency, Brightness, and Reliability of Organic Light Emitting Devices," Appl. Phys. Lett., 70(11):1348-1350 (Mar. 1977).

* cited by examiner (a)

(b)

ELECTRO-OPTIC DIODE DEVICES

BACKGROUND OF THE INVENTION

This invention relates to electro-optic diode devices, and especially but not exclusively to high efficiency electro-optic diode devices having polymer and metal oxide components.

Related Technology

Polymer-based electronics has developed rapidly over the last decade. In particular, the phenomenon of electroluminescence in conjugated semiconducting polymers spurred wide interest in the field. (J. H. Burroughes, D. D. C. Bradley, A. R. Brown, R. N. Marks, K. Mackay, R. H. Friend, P. L. Burns, A. B. Holmes, Nature 1990, 347, 539). Many fundamental optoelectronics devices such as lasers, polymer light emitting diodes (PLEDs), thin film transistors, photovoltaics (PVs), and optical sensors have been realized in research laboratories, and some are already incorporated in commercial applications. Examples of such devices are described in R. H. Friend, R. W. Gymer, A. B. Homes, J. H. Burroughes, R. N. Marks, C. Taliani, D. D. C. Bradley, D. A. D. Santos, J. L. Bredas, M. Logdlund, W. R. Salaneck, Nature 2001, 397, 121; M. Muccini, Nat. Mater. 2006, 5, 605; G. Li, V. Shrotriya, J. Huang, Y. Yao, T. Moriarty, K. Emery, Y. Yang, Nat. Mater. 2005, 4, 864 and D. Kabra, Th. B. Singh, K. S, Narayan, Appl. Phys. Lett. 2004, 85, 5073.

However, there is still scope for improvement in device stability and in the effectiveness of the charge injecting/transporting layers chosen for LEDs (light emitting diodes). The conventional PLED structure employs electrodes of low work function metals, which require hermetical encapsulation to operate in ambient conditions. Even relatively stable Mg—Ag cathodes have been found to degrade gradually due to oxidation. (See H. Aziz, Z. Popovic, C. P. Tripp, N-X. Hu, A.-M. Hor, G. Xu, Appl. Phys. Lett. 1998, 72, 2642 and J. McElvain, H. Antoniadis, M. R. Hueschen, J. N. Miller, D. M. Roitman, J. R. Sheats, R. L. Moon, J. Appl. Phys. 1996, 80, 6002).

Conventional PLEDs use Poly(3,4-ethylenedioxythiophene)poly(styrenesulfonate) (PEDOT:PSS) as the hole injecting anode and Ca—Al bilayers as the electron injecting cathode. (See J. S. Kim, R. H. Friend, Appl. Phys. Lett. 2005, 87, 023506). Alternatively, metal-oxide semiconductors can be employed as charge transport and injection layers, as has been illustrated for charge collection electrodes in photovoltaic diodes. (See K. Morii, M. Ishida, T. Takashima, T. Shimoda, Q. Wang, M. K. Nazeeruddin, M. Gratzel, Appl. Phys. Lett. 2006, 89, 183510; K. Lee, J. Y. Kim, S. H. Park, S. H. Kim, S. Cho, A. J. Heeger, Adv. Mat. 2007, 19, 2445 and H. J. Bolink, E. Coronado, D. Repetto, M. Sessolo, Appl. Phys. Lett. 2007, 91, 223501). These metal oxides have advantages of exceptional stability, mechanical and electrical robustness, low cost, transparency in the visible range, solution processable fabrication and the potential for control of their film morphologies and interfacial electronic structures. Some specific composite oxide-polymer based diodes have been investigated with a view to improving device stability (K. Morii, M. Ishida, T. Takashima, T. Shimoda, Q. Wang, M. K. Nazeeruddin, M. Gratzel, Appl. Phys. Lett. 2006, 89, 183510; K. Lee, J. Y. Kim, S. H. Park, S. H. Kim, S. Cho, A. J. Heeger, Adv. Mat. 2007, 19, 2445 and H. J. Bolink, E. Coronado, D. Repetto, M. Sessolo, Appl. Phys. Lett. 2007, 91, 223501). These can compare favorably with conventional PLED architectures. In addition to being unsusceptible to oxidization, metal oxides also provide a good double heterojunction structure for charge carrier confinements.

Key performance criteria for such light emissive devices include their electrical and/or optical performance, for example their efficiency. It would be desirable to further improve the electrical and/or optical performance of light emissive devices.

SUMMARY OF THE INVENTION

According to one aspect of the present invention there is provided a diode device comprising: a first electrode; a second electrode; an organic light emissive or responsive component comprising a molecular semiconductor material located between the first electrode and the second electrode; and a first charge transport layer of a material having a refractive index greater than 1.85 located between the first electrode and the organic light emissive or responsive component for transporting charge between that electrode and the organic light emissive or responsive component; wherein the structure of the device is such that optical loss due to the electrodes for a mode guided within the plane of the device is sufficiently low as to support optical gain within the device in the presence of a luminescent component.

The device need not comprise the said luminescent component. The optical loss due to the electrodes for a mode guided within the plane of the device may be sufficiently low as to support optical gain within the device in the presence of a luminescent component whether or not such a component is present.

Further preferred features are set out in the appended claims and in the following description and drawings.

Materials referred to in the description and claims could be material systems comprising two or more components.

The electrodes may be metallic electrodes.

The first charge transport layer and/or the material(s) of which it/they is/are composed may independently have a refractive index greater than 1.85, greater than 1.9 or greater than 2.0. Instead of having a refractive index greater than such values, the first and/or second charge transport layers could independently be of materials that comprise metal oxides.

BRIEF DESCRIPTION OF THE DRAWINGS

The present invention will now be described by way of example with reference to the accompanying drawings. In the drawings.

DETAILED DESCRIPTION

The luminescent devices to be described below use a variety of metal oxides in mesoporous and compact forms for electron injection. This has been found to allow for highly luminescent COPLEDs. In one form of device that has been found to be particularly effective, ZnO is used as an electron transport and injection material and MoO$_3$ is used as a hole injection material. Furthermore, structure allows scope for selection of materials and the thicknesses of the components in order to enhance photonic effects.

Device Structures

Figure 1:
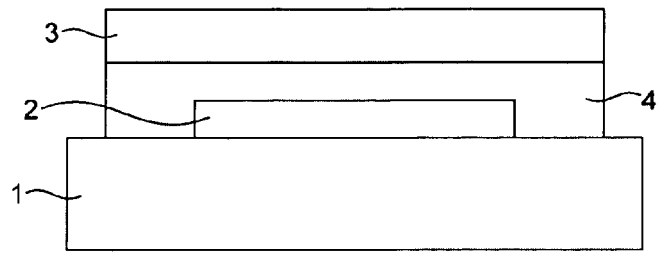
FIG. 1 shows the basic structural form of devices discussed herein.

The basic schematic form of the devices described herein is shown in FIG. 1. The devices comprise a substrate 1 (for instance of glass) on which is deposited a cathode structure 2 for electron transport and injection, and an anode structure 3 for hole transport and injection. A light-emissive structure 4 is sandwiched between the cathode and the anode. In the devices that have been studied, the cathode, anode and light-emissive structures take the form of layers, and have been built up layer-by-layer by successive deposition on the substrate. However, the present invention is not limited to devices of that schematic form, or that have been fabricated in that manner.

Figure 2:
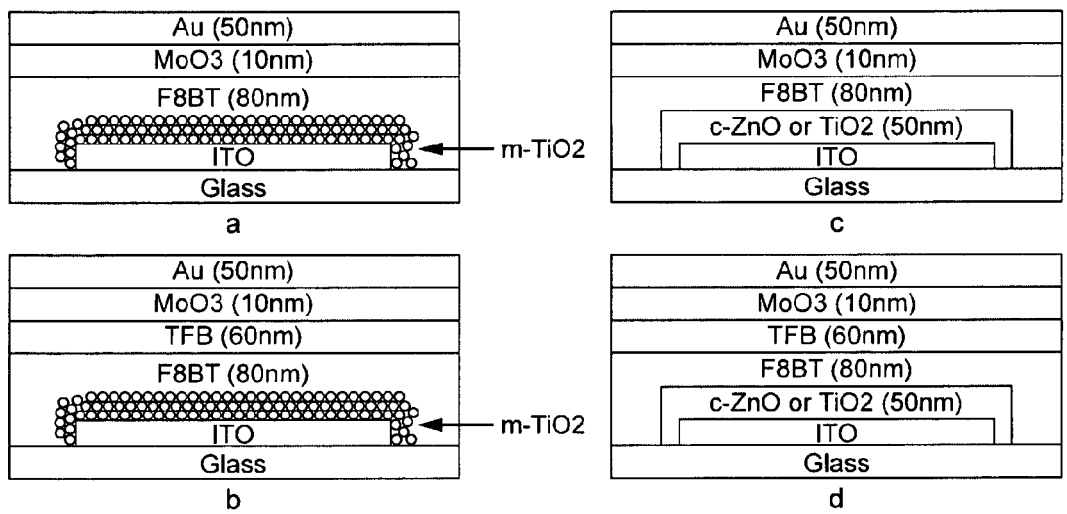
FIG. 2 shows specific examples of device structures having a MoO$_3$ layer for hole injection and (a) a single F8BT layer with a mesoporous TiO$_2$ layer ("m-TiO$_2$") for electron injection, (b) an F8BT/TFB bilayer with m-TiO$_2$ for electron injection, (c) a single F8BT layer with a compact metal oxide layer for electron injection and (d) an F8BT/TFB bilayer with a compact metal oxide layer for electron injection.

FIG. 2 shows more specifically some schematic forms of COPLEDs that are discussed below. These will be referred to herein as devices A to D. The components of the devices of FIG. 2 are summarised in the following table.

TABLE 1

| Device | FIG. | Cathode structure | Light-emissive structure | Anode structure |
|---|---|---|---|---|
| A | FIG. 2a | ITO, m-TiO$_2$ | F8BT | Au, MoO$_3$ |
| B | FIG. 2b | ITO, m-TiO$_2$ | F8BT | Au, MoO$_3$, TFB |
| C | FIG. 2c | ITO, c-ZnO or c-TiO$_2$ | F8BT | Au, MoO$_3$ |
| D | FIG. 2d | ITO, c-ZnO or c-TiO$_2$ | F8BT | Au, MoO$_3$, TFB |

"m-TiO$_2$" refers to mesoporous TiO$_2$. "c-ZnO" refers to compact ZnO. "c-TiO$_2$" refers to compact TiO$_2$.

The COPLEDs were fabricated with either a single polymer layer of poly[(9,9-dioctylfluoren-2,7-diyl)-co-(1,4-benzo-{2,1'-3}-thiadiazole)] (F8BT) as emissive layer, or with a bilayer of F8BT and poly(2,7-(9,9-di-n-octylfluorene)-alt-(1,4-phenylene((4-sec-butylphenyl)imino)-1,4-phenylene)) (TFB) sandwiched between the metal oxide charge transport and injection layers.

Figure 3:
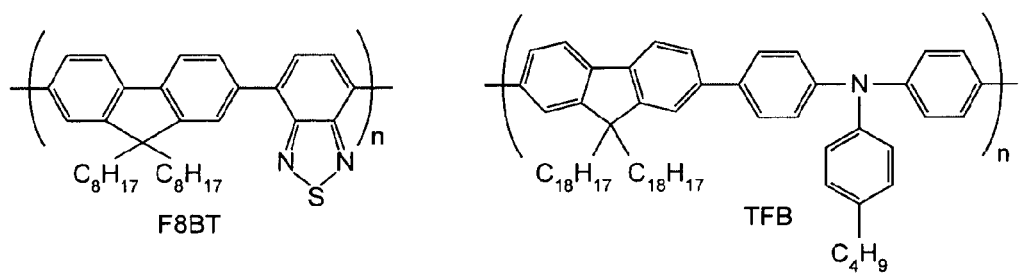
FIG. 3 shows the chemical structures of F8BT and TFB.

The chemical structures of the polymers F8BT and TFB are shown in FIG. 3. TFB is a triarylamine-based wide band gap semiconductor ($E_g$>3.0 eV) often used as a hole transporter due to its low ionization potential (~−5.33 eV) and high hole mobility. (See J.-S. Kim, P. K. H. Ho, C. E. Murphy, R. H. Friend, Macromolecules 2004, 31, 2861).

The devices were manufactured as follows. ITO substrates were cleaned using a conventional wet cleaning process. Compact $TiO_2$ (c-$TiO_2$) layers, of approximately 50 nm thickness, were fabricated by employing spray pyrolysis deposition (SPD) on ITO substrates at 450° C. using a titania precursor (di-iso-propoxy-titanium bis(acetylacetonate) from Aldrich) in absolute ethanol solution (1:10 vol:vol) (L. Kavan, M. Grätzel, Electrochim. Acta. 1995, 40, 643) and compact ZnO (c-ZnO) layer from Zinc acetate dihydrate (from Fluka) in anhydrous methanol (80 g/l). (See P. M. K. Ratheesh, C. S. Kartha, K. P. Vijaykumar, F. Singh, D. K. Avasthi, Mater, Sci. Eng B 2005, 117, 307). Mesoporous $TiO_2$ (m-$TiO_2$) films were fabricated by spin coating from a colloidal suspension of nanoparticles in a polymer matrix on a compact $TiO_2$ layer with total thickness of ~120 nm. (See H. J. Snaith, L. S.-Mende, M. Grätzel, M. Chiesa, Phys. Rev. B 2006, 74, 045306). Subsequent annealing at 450° C. sintered the particles and burnt the polymer leaving a mesoporous film with approximately 60% porosity. F8BT polymer ($M_n$=97 K) was spin coated from a p-xylene solution with the concentration of 14 g/l (thickness ~80 nm).

Bilayers of TFB ($M_n$=130 K) on F8BT were obtained by using a "water-float-off" and lamination technique; (J. A. Barker, C. M. Ramsdale, N. C. Greenham, Phys. Rev. B 2002, 67, 075205) TFB polymer films (thickness ~60 nm) were prepared on $O_2$ plasma treated glass substrates coated with PSS layers to aid float-off in water and F8BT coated samples were laminated directly to the "dry side" of these floated TFB films. All samples were annealed at 150° C. under nitrogen atmosphere to improve the morphology of the F8BT in terms of enhanced emission. (C. L. Donley, J. Zaumseil, J. W. Andreasen, M. M. Nielsen, H. Sirringhaus, R. H. Friend, J.-S. Kim, J. Am. Chem. Soc. 2005, 127, 12890).

Finally, the samples were transferred to a thermal evaporation chamber for deposition of $MoO_3$ (10 nm) (powder, 99.999% from Testbourne) and Au (50 nm) under high vacuum ($1\times10^{-6}$ mbar).

It should be noted that the orientation of these devices is opposite to the more normal configuration. More normally, devices are built up on the anode, whereas the devices described above are built up on the cathode. Whilst not being essential to the principles described herein, this orientation is advantageous since it allows devices having polymer bilayers of the type discussed herein to be more readily fabricated.

Samples were also prepared in a similar manner on quartz substrates, with and without the compact layers, to check polymer film morphology and photoluminescence efficiency (PLE).

Current density (measured using a Keithley 195 electrometer) and luminance versus applied voltage (measured using a Keithley 230 source-meter) characteristics for m-$TiO_2$, c-$TiO_2$ and c-ZnO electron transporting layers in single F8BT and F8BT/TFB bilayer devices were measured in air using a calibrated reference Si photodetector.

Results

Figure 4:
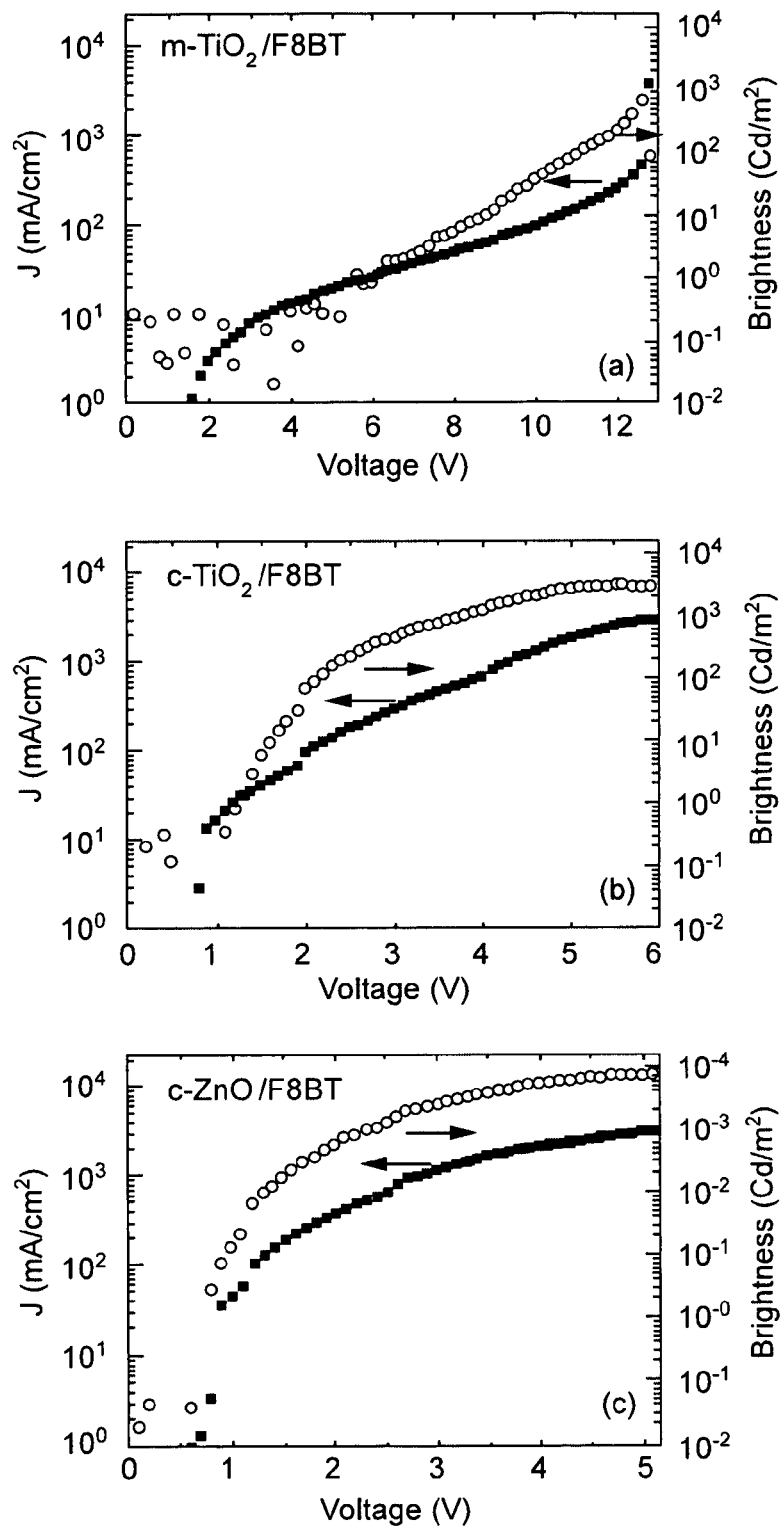
FIG. 4 shows plots of the characteristics of current density versus voltage (J-V) (squares) and luminance versus voltage (L-V) (circles) for devices having a MoO$_3$ layer as hole-injecting layer and the following electron injecting metal oxide layers and polymer layers: (a) m-TiO$_2$ with F8BT, (b) c-TiO$_2$ (compact TiO$_2$) with F8BT, (c) c-ZnO (compact ZnO) with F8BT, (d) m-TiO$_2$ with a TFB:F8BT bilayer, (e) c-TiO$_2$ with a TFB:F8BT bilayer, (f) c-ZnO with a TFB:F8BT bilayer.
Figure 4:
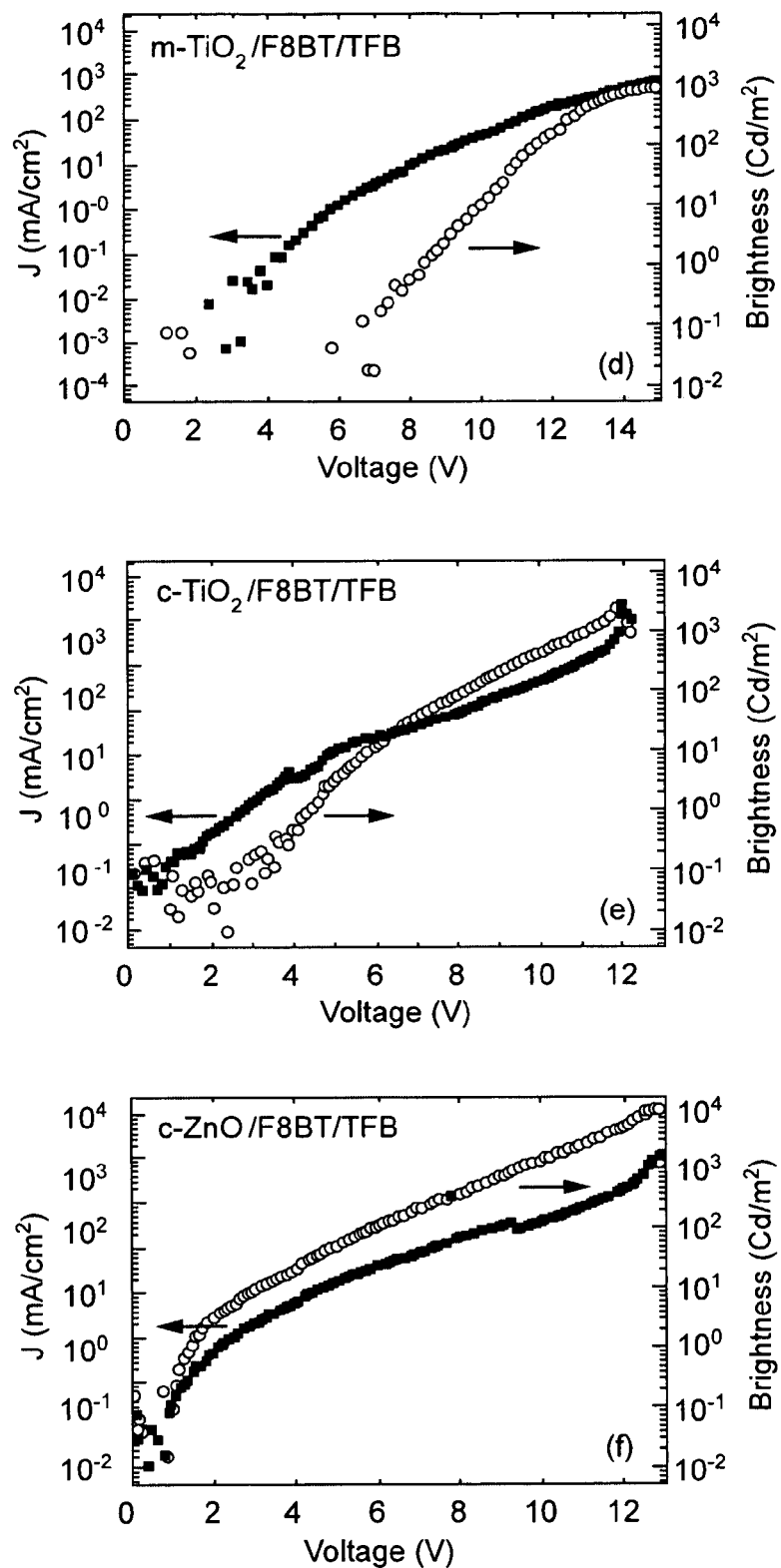

FIG. 4 shows the J-V-L curves for the series of COPLEDs A to D. These results indicate a number of features.

First, FIG. 4 indicates that the devices that have the compact flat metal oxide layers (devices C and D) work significantly better than those that have the mesoporous structures (devices A and B). It is believed that this may be due to the fact that efficient charge injection into a pristine undoped polymer requires an electric field, which is maximized at the interface in a planar geometry. The devices that incorporate compact metal oxide layers (devices C and D) exhibit extremely low turn-on voltages, with the devices that include a layer of compact ZnO in the cathode structure turning on at under 1V. This is an especially low result when it is considered that the luminance from the device is green (approximately 2.3 eV). It is believed that this exceptionally low turn-on voltage might be explained by a thermally assisted injection mechanism occurring at the electrodes and/or at the F8BT/TFB interface in the case of bilayer devices.

FIG. 4 also indicates that the bilayer devices (devices A and B) are more efficient than the devices that have a single polymer layer (devices C and D), but with slightly higher turn-on voltages (note the increased total polymer film thickness: approximately 140 nm for the bilayer devices), as shown in FIG. 4 and table 2 below. Table 2 shows maximum luminance, luminance efficiency and turn-on voltages for different COPLEDs structures. The asterisk sign as superscript indicates that the listed values for luminance and efficiency have been corrected according to the non-Lambertian light emission pattern.

TABLE 2

| | Maximum luminance (Cd/$cm^2$) | Maximum Luminance Efficiency (Cd/A) | Turn on Voltage (V) |
|---|---|---|---|
| m-$TiO_2$/F8BT | 602 | 0.13 | ~3.60 |
| (c-$TiO_2$/F8BT)* | 3021 | 0.18 | ~1.10 |
| (c-ZnO/F8BT)* | 9370 | 0.34 | ~0.60 |
| m-$TiO_2$/F8BT/TFB | 874 | 0.15 | ~5.80 |
| (c-$TiO_2$/F8BT/TFB)* | 3222 | 0.33 | ~1.24 |
| (c-ZnO/F8BT/TFB)* | 16460 | 0.93 | ~0.87 |
| c-ZnO/F8BT/TFB | 2150 | 2.81 | ~3.60 |

The better performance of the bilayer devices may be attributed to the role of the TFB layer. The TFB layer is believed to reduce any potential exciton quenching at the F8BT/$MoO_3$ interface, observed in the PL quenching measurements presented in table 3 below, and it also acts as a good hole transporting material with a very well matched HOMO level (approximately −5.3 eV) (see Y. Xia, R. H. Friend, Macromolecules 2005, 38, 6466) to the valence band of $MoO_3$ (~−5.3 eV). (See 1. L. Kavan, M. Grätzel, Electrochim. Acta. 1995, 40, 643 and 1. S. Tokito, K. Noda, Y. J. Taga, Phys. D Appl. Phys. 1996, 29, 2750). In contrast, the phenomenally low turn-on voltages observed in the single polymer layer devices suggest that there is effective hole injection from $MoO_3$ into F8BT.

Table 3 shows the photoluminescence efficiency of annealed F8BT films in combination with electron and hole injecting metal oxide layers measured inside an integrating sphere with an excitation wavelength of 475 nm.

TABLE 3

| | F8BT | c-$TiO_2$/F8BT | c-ZnO/F8BT | F8BT/$MoO_3$ |
|---|---|---|---|---|
| $\eta_{PLE}$ | 0.78 | 0.64 | 0.75 | 0.54 |

The results presented herein indicate that, in terms of luminance, efficiency and turn-on voltages, devices that include compact TiO$_2$ as electron injector perform considerably better than devices including mesoporous TiO$_2$ as electron injector, and that devices including compact ZnO as electron injector perform significantly better than those using either mesoporous or compact TiO$_2$. Devices incorporating compact ZnO layers were found to be the best of the three materials tested, and they were found to perform equally well as conventional ITO/PEDOT:PSS and Ca—Al based bilayer LEDs, both in terms of turn-on voltages and luminance (see L. Kavan, M. Graztel, Electrochim. Acta. 1995, 40, 643), with the advantage of substantial air stability. The finding that compact ZnO is a highly effective electron injection layer into F8BT based LEDs is in agreement with a recent report by Bolink et al. (H. J. Bolink, E. Coronado, D. Repetto, M. Sessolo, Appl. Phys. Lett. 2007, 91, 223501).

The reason why the efficiency of these devices is lower than conventional structures, though the luminance and turn on voltages are directly competitive, is believed possibly to be that the current densities are higher. (See 1. Y. Xia, R. H. Friend, Adv. Mater. 2006, 18, 1371). These higher current densities might be due to leakage current through metal-oxide compact layers. Formation of such layers could be inhibited by improved deposition techniques, which might enhance the performance still further.

Conventional polymer blend based LEDs show higher efficiency when compared to devices made up by the "water-float-off" technique in standard PEDOT:PSS-Ca/Al structures. (A. C. Morteani, A. S. Dhoot, J.-S. Kim, C. Silva, N. C. Greenham, R. H. Friend, C. Murphy, E. Moons, S. Ciná, J. H. Burroughes, Adv. Mater. 2003, 15, 1708). This may be due to the possible contamination of polymer interfaces in bilayer structures in this technique. It has been observed that films cast from blends of these polymers have a TFB wetting layer predominantly contacting the substrates due to vertical phase separation and surface energy contrast. (See Y. Xia, R. H. Friend, Adv. Mater. 2006, 18, 1371). This is advantageous for the conventional structure, however disadvantageous for the "inverted" structure described herein. Surface chemistry, to enable wetting of the metal oxide with the F8BT phase, is advantageous for the present inverted LED structures.

Figure 5:
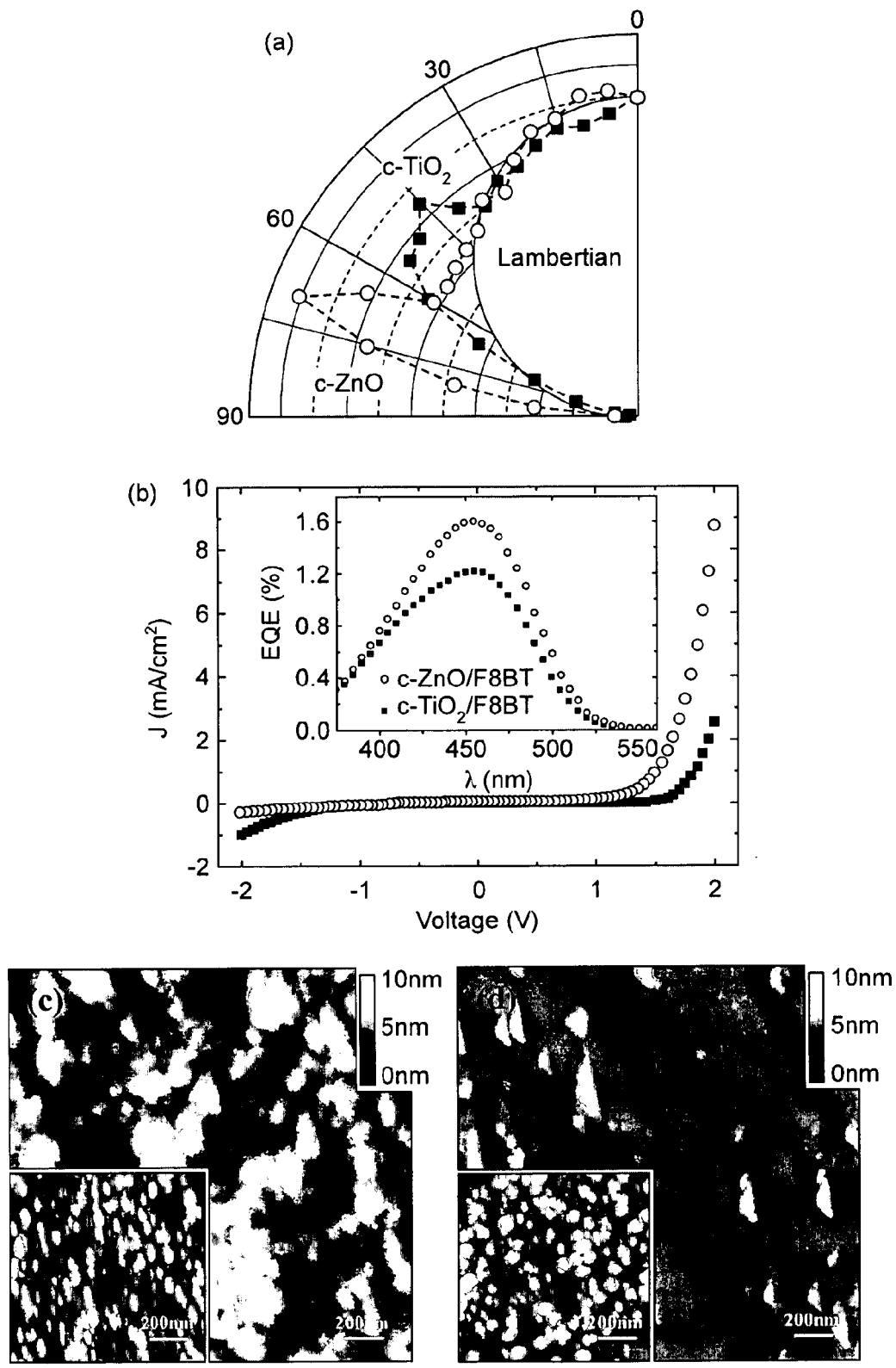
FIG. 5 shows:
(a) Plots of angular emission patterns from single-layer composite oxide-polymer LEDs ("COPLEDs") having electron injecting layers of c-ZnO (circles) and c-TiO$_2$ (squares); and simulated Lambertian emission (shaded grey).
(b) Dark current density (J) versus voltage (V) characteristics for devices of structure ITO/c-TiO$_2$ (squares) and c-ZnO (circles) with F8BT/MoO$_3$/Au.
(inset to b) The photovoltaic action spectra for charge carrier collection in photovoltaic mode was done on single layer COPLEDs (ITO/c-ZnO or c-TiO$_2$/F8BT (80 nm)/MoO$_3$ (10 nm)/Au (50 nm)) structure without TFB layer at low intensity using monochromator and tungsten lamp.
(c) and (d) Tapping mode atomic force microscopy images of F8BT films spin-coated on (c) c-TiO$_2$ and (d) c-ZnO layers on quartz substrates.
(insets to c and d) The bare compact metal oxide layers of the respective devices on height scales 0 to 10 nm.
Figure 6:
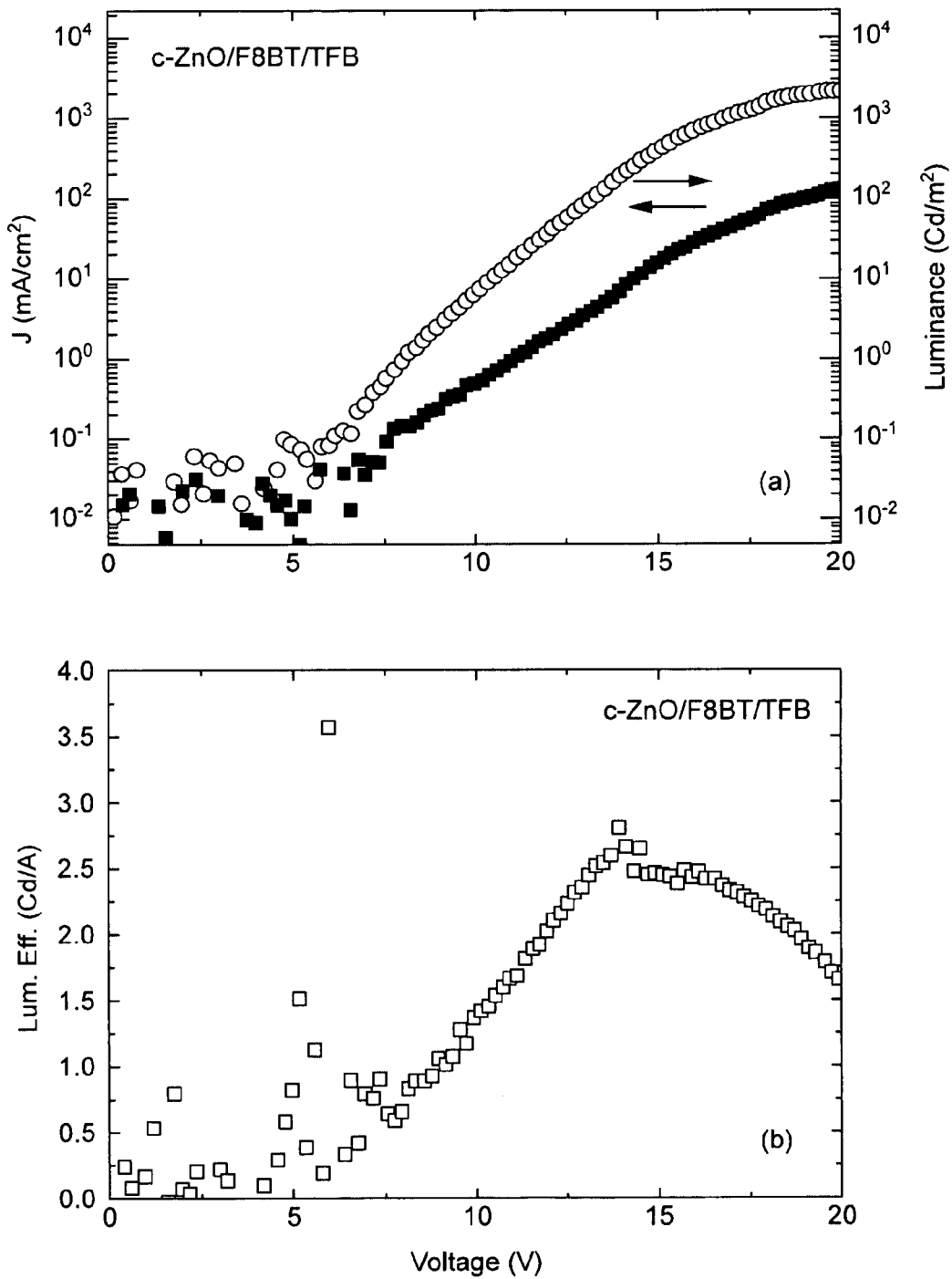
FIG. 6 shows plots of the characteristics of (a) current density versus voltage (J-V) (squares) and luminance versus voltage (L-V) (circles) and (b) luminance efficiency versus voltage, in each case for a thicker ZnO electron injecting layer in a device having an F8BT/TFB bilayer. MoO$_3$ was used as hole-injecting layer. Here, the calculation of luminance accounts for a corrected non-Lambertian emission pattern.

FIG. 5a shows angular electroluminescent emission patterns (in the far field) from devices formed as described above. These patterns deviate considerably from Lambertian emission patterns expected from conventional PLEDs. (See N. C. Greenham, R. H. Friend, D. D. C. Bradley, Adv. Mater, 1994, 6, 491 and J.-S. Kim, P. K. H. Ho, N. C. Greenham, R. H. Friend, J. Appl. Phys. 2000, 88, 1073). This is believed to result from the high refractive index (n$_r$) of the metal oxide layers (n$_{r-ZnO}$≈1.9 at 550 nm and n$_{r-TiO2}$≈2.4) used in the COPLEDs described herein, which results in optical waveguiding and non-Lambertian emission.

These measurements illustrate that corrections need to be made to the basic measurements to accurately estimate the luminance and luminance efficiency for these COPLEDs: In the measurement used by the inventors a Si photodetector was located in the forward direction with the initial luminance output calculated assuming a Lambertian emission. Accounting for the measured emission patterns, a correction factor of 1.3 for compact ZnO and 1.06 for compact TiO$_2$ based COPLEDs needs apparently to be applied. It is noted that the internal quantum efficiency is likely to be lower than usual for these structures due to re-absorption of some of the waveguided light (in both the polymer and the gold).

Our comparative study of J-V-L characteristics for these two compact metal oxide layers (TiO$_2$ vs ZnO) indicates that there is a slight difference in terms of electron injection characteristics into F8BT, apparent from the slightly lower turn-on voltages in case of compact ZnO. We have further investigated the electron injecting properties of these compact layers by diode characteristics in COPLED structures, as shown in FIG. 5(b). These J-V characteristics are consistent with the compact ZnO layer having a lower turn-on voltage and good rectification properties. This suggests it is a better choice electronically. The surfaces of these two metal oxides have an important distinction in terms of polarity. The bonding in both TiO$_2$ and ZnO is substantially ionic. The surface of ZnO is generally polar due to charge transfer occurring instead of reconstruction of the surface, which leads to metallization of a single crystalline ZnO surface. (A. Wander, F. Schedin, P. Steadman, A. Norris, R. McGrath, T. S. Turner, G. Thornton, N. M. Harrison, Phys. Rev. Lett. 2001, 86, 3811). It is believed that the presence of the positive Zn ions at the surface can lead to a favourable shift in energy and improved electron injection. Conversely, TiO$_2$ has a lower surface polarity than ZnO. Photoluminescence efficiency (PLE) measurements, summarized in table 3, demonstrate that the PLE of F8BT on TiO$_2$ is considerably lower than on ZnO, the latter being similar to that of F8BT measured on blank quartz substrates. This could perhaps either be due to exciton quenching occurring at the compact TiO$_2$/F8BT interface or due to poor polymer film morphology resulting in lower luminance efficiency.

COPLEDs were tested in photovoltaic mode to check the possibility of charge generation between the polymer and the metal-oxide layers, as shown in the inset of FIG. 5b. Generally low current collection efficiencies were observed, but the current collection efficiencies were higher for COPLEDs including compact ZnO than for compact TiO$_2$ based COPLEDs. This suggests that the variation in PLE is due to variations in polymer morphology and not due to excessive exciton quenching at the polymer metal oxide interface. Measurements of photoinduced absorption and transient absorption confirmed that there was negligible charge generation at the polymer metal oxide interface.

To investigate the morphology of the emissive F8BT layer on the underlying compact metal oxide films, atomic force microscopy (AFM) was performed in tapping mode, as shown in FIGS. 5c and 5d. The compact metal oxide layers appear to be polycrystalline with almost similar domain size (~40 nm) and roughness (~5 nm), FIGS. 5c and d insets. (See also S. A. Studenikin, N. Golego, M. Cocivera, J. Appl. Phys. 2000, 87, 2413). The film-forming properties of the F8BT on these two metal oxide surfaces are indeed very different, as shown in FIGS. 5c and 5d, demonstrating the different wetting conditions of polymer solutions on polar and non-polar oxide surfaces. The morphological inhomogeneities of the F8BT on compact TiO$_2$ are consistent with the larger leakage current in c-TiO$_2$/F8BT/MoO$_3$ device under reverse bias, as shown in FIG. 5b, where the leakage could result from pinholes in the TiO$_2$ or close contact between the MoO$_3$ and the TiO$_2$ due to the rougher polymer film. Most importantly, poor polymer morphology can also lead to non-radiative recombination of excitons, hence resulting in lower luminance efficiency and less efficient electroluminescent devices, (see J. Liu, Y. Shi, L. Ma, Y. Yang, J. Appl. Phys. 2000, 88, 605) consistent with our photo- and electroluminescence measurements By increasing the thickness of the metal oxide layers, the luminance is reduced and the turn-on voltage increased, however the efficiency can be considerably improved. For the particular batch of devices presented in FIGS. 4a and b and at the bottom of Table 2, the thickness of MoO$_3$ (~20 nm) and compact ZnO (~120 nm) layers was modified. The efficiency of these devices peaks at 2.8 Cd/A at 14V.

Improved performance, specifically higher luminance and lower turn-on voltages, were observed when no $O_2$ plasma treatment was performed on the ITO prior to the deposition of a metal oxide in contact with it. This observation is consistent with the absence of $O_2$ plasma treatment causing a reduced injection barrier at the ITO/compact $TiO_2$ (c-$TiO_2$) or compact ZnO (c-ZnO) interface. $O_2$ plasma etching is known to increase the work function of ITO. (See C. C. Wu, C. I. Wu, J. C. Sturm, A. Kahn, Appl. Phys. Lett. 1997, 70, 1348).

The results presented above indicate that mesoporous $TiO_2$ (m-$TiO_2$) based devices show similar or better performance, in terms of turn on voltages and luminance efficiency, to those observed in a recent report by Haque et al. (S. A. Haque, S. Koops, N. Tokmoldin, J. R. Durrant, J. Huang, D. D. C. Bradley, E. Palomares, Adv. Mater. 2007, 19, 683). Polymer LEDs using a compact ZnO layer for electron injection have been found to be superior to devices using either compact or mesoporous $TiO_2$. Devices have been found to exhibit turn-on voltages of less than 1 V and maximum efficiencies of up to 2.8 Cd/A. The devices discussed herein have been found to show excellent air stability under operation.

The results presented above indicate that compact $TiO_2$ layers deliver superior diode electroluminescence performance and electron injection characteristics as compared to mesoporous electrodes; that compact ZnO based devices exhibit improved electrical and optical performances as compared to compact $TiO_2$ based device; and that the addition of a TFB interlayer between F8BT and $MoO_3$ improves device performance, with a record level of luminance close to 3Cd/A reported. Device performance could be improved still further by improving the homogeneity of the F8BT morphology on the compact $TiO_2$ surfaces, for example by improved control of the processing route and/or surface treatments to improve the wetability of the polymer. The identification of ZnO as an effective charge injecting layer elucidates an LED structure which offers increased efficiency, luminance and low turn-on voltages, representing a versatile option for further developments in molecular or polymeric LED technologies. Furthermore, the considerable wave guiding in these devices, due to the highly refractive metal oxide layers, enables significantly increased control over the optical out coupling and emission direction with the introduction of photonic structures.

To promote waveguiding of the $TE_0$ mode, it is preferred to that on either side of the region of the device that performs emission are regions that have a lower refractive index than the emissive region.

Further improved device performance can be achieved through the use of an electron injection layer of ZnO nanorods rather than bulk ZnO. ZnO nanorods can be used in place of bulk ZnO in the device structures described above. Preferably the nanorods are capped by a hole-blocking layer such as $Cs_2CO_3$ which improves the device efficiency. It is also advantageous in terms of device performance if TFB is used as the hole transporting layer—this improves device luminance, as described above.

Figure 12:
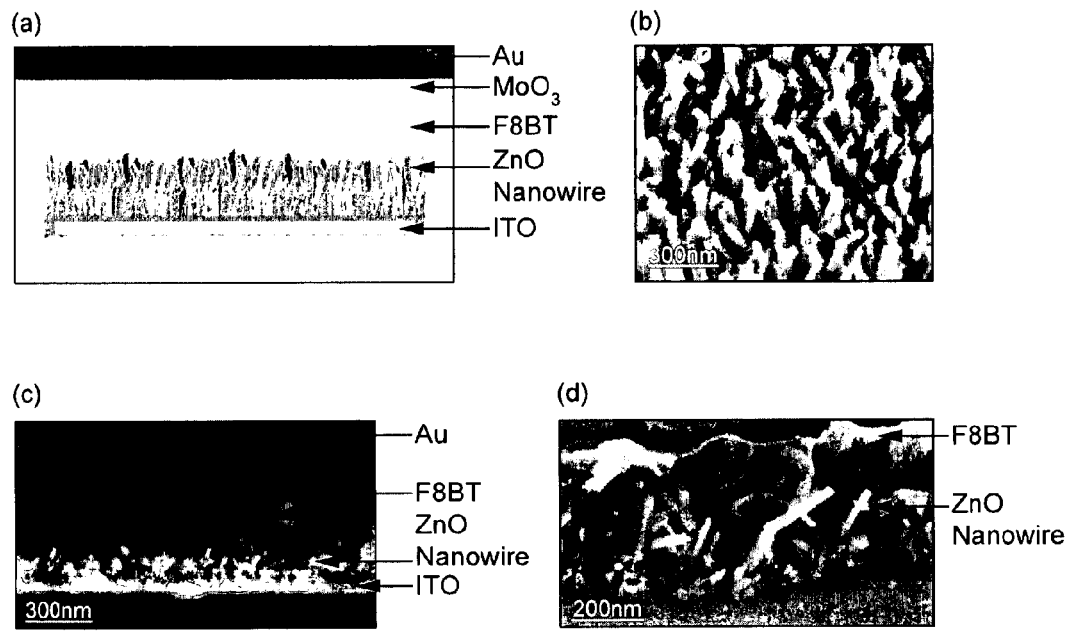
FIG. 12 shows: (a) schematic representation of COPLED structures with ZnO nanorods as an electron injecting layer; (b) scanning electron microscope image of ZnO nanorods (top-view); side view of a device composed of ZnO nanorods of length (c) 110 nm and (d) 380 nm with F8BT film (500 nm thick). Polymer infiltration can be seen in (d) due to the longer rods having less volume percent coverage.

Four images of a COPLED having a ZnO nanorod electron injecting layer are shown in FIG. 12. Image (a) is a schematic representation of a COPLED structure with ZnO nanorods as an electron injecting layer. Note that the long axis of the nanorods is oriented perpendicular to the plane of the film layers. Image (b) is a scanning electron microscope top view of a layer of ZnO nanorods. Images (c) and (d) are electron microscope side views of layers of ZnO nanorods of lengths 110 nm and 380 nm, respectively. A 500 nm thick layer of F8BT film can be seen over the nanorods. In image (d) in particular, polymer infiltration can be seen due to the longer rods having a lower percentage volume coverage.

A layer of ZnO nanorods can be prepared using hydrothermal deposition technique at temperature below 90° C. The length of the nanorods can be controlled by varying the time of the substrate in a chemical bath in the presence of the appropriate precursors: typically, 0.025 M zinc nitrate hydrate and 0.025 M hexamethylenetetramine in water. Methods for growing ZnO nanorods are known in the art and in particular, further details explaining the hydrothermal growth of ZnO nanorods can be found in "A simple low temperature synthesis route for ZnO—MgO core-shell nanowires", N. O. V. Plank et al., Nanotechnology 19, 465603 (2008). The preferred minimum length of the nanorods is 110 nm, which can be achieved by minimizing the time in the chemical bath. This low temperature synthesis process makes such PLEDs suitable for use on many kinds of flexible substrates.

The diameters of crystalline ZnO nanorods grown by hydrothermal deposition are typically in the range of 20 to 50 nm, with a centre-to-centre separation of approximately 100 nm (estimated from SEM images). From SEM images it can be seen that the spacing between ZnO nanorods is irregular, with adjacent nanorods having a tendency to tilt towards each other. Since the nanorods are not perfectly aligned, the fractional density of a ZnO nanorod layer is typically 85-90% of the layer volume.

Figure 13:
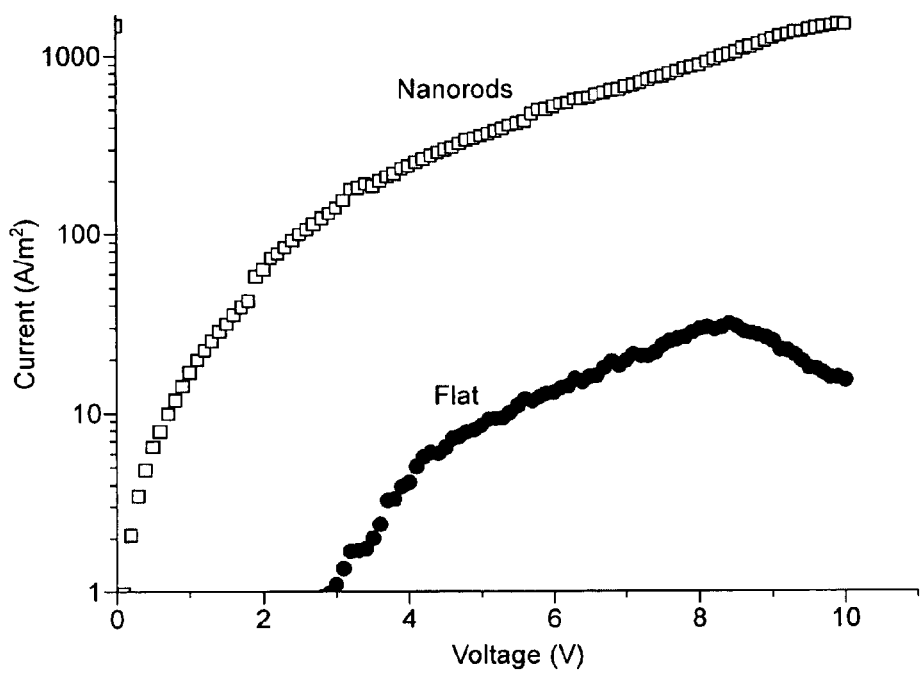
FIG. 13 shows J-V characteristics for an inverted electron only device with flat ZnO (filled circles) and ZnO nanorods (hollow squares) (length 110 nm) as an electron injecting layer. Al was used as a top contact electrode. A hole blocking layer was used for both devices having a similar thickness to the layer of F8BT.

FIG. 13 shows the improvement in current density of an inverted electron only device when using a ZnO nanorod layer (hollow squares) as the electron injecting layer as compared to a layer of bulk (flat) ZnO (filled circles). The nanorods had a length of 110 nm and aluminum was used as the top contact electrode. A hold blocking layer of thickness similar to that of the F8BT layer was used for both the nanorod and bulk ZnO devices. The current density of a device having a ZnO nanorod electron injecting layer is around two orders of magnitude greater than a device having a bulk ZnO electron injecting layer.

Figure 14:
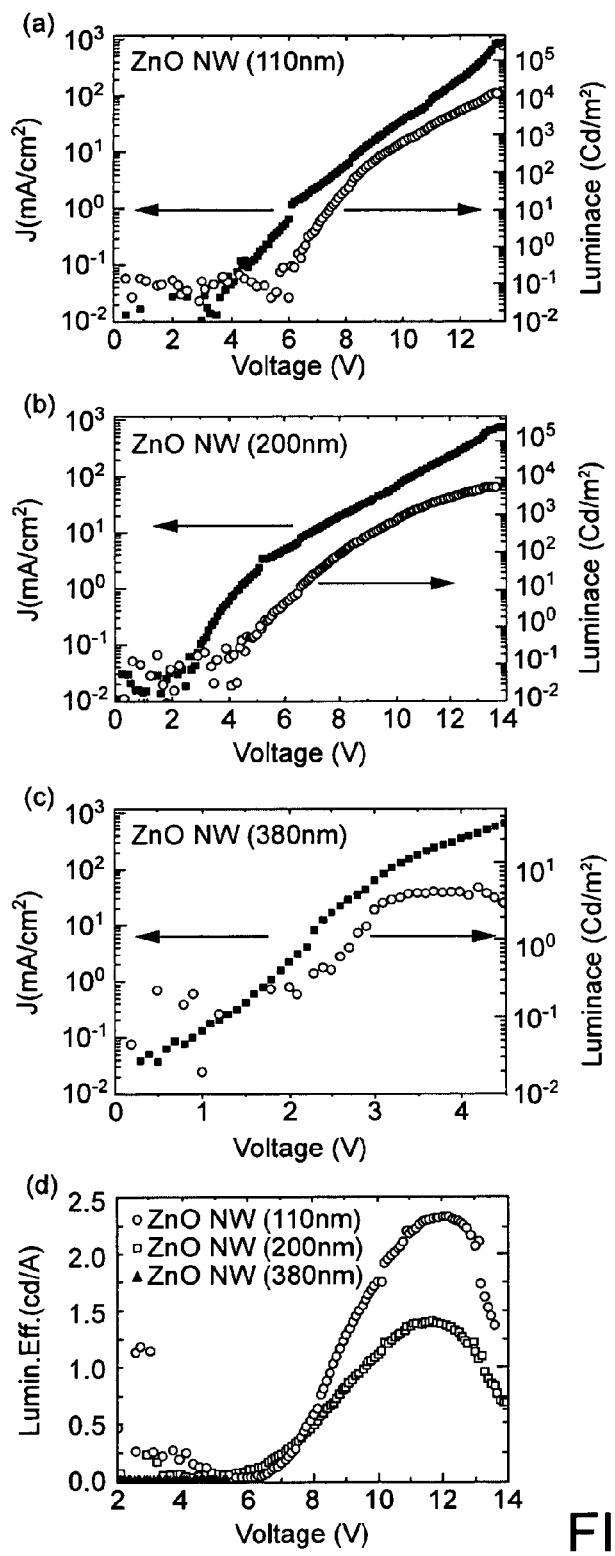
FIG. 14 shows current density vs voltage (J-V) (filled squares) and luminance vs voltage (L-V) (hollow circles) characteristics of electron injecting ZnO nanorods with (a) 110 nm, (b) 200 nm and (c) 380 nm in lengths with single F8BT (660 nm thickness) layer based COPLEDs; (d) shows luminance efficiency vs voltage for ZnO nanorod electron injecting layers having the 110 nm (hollow circles), 200 nm (hollow squares) and 380 nm (filled triangles) nanorod lengths.

Further examples of the improved performance of COPLED devices using an electron injecting layer of ZnO nanorods are shown in FIG. 14. In each of the graphs (a) to (c), current density vs. voltage (the J-V curve) is depicted by a filled square and luminance vs. voltage (the L-V curve) is depicted by a hollow circle. Graphs (a) to (c) show the characteristics of devices comprising ZnO nanorods of length 110 nm, 200 nm and 380 nm, respectively. Each device has a single F8BT layer of 660 nm thickness. Luminance efficiency vs. voltage is shown for the same three devices in graph (d). It can be seen from FIG. 14 that it is advantageous if the length of the ZnO nanorods is chosen to be less than 380 nm. Most preferably the ZnO nanorods are less than 200 nm long, and ideally around 110 nm long.

The use of ZnO nanorods as the electron injecting layer offers several advantages over bulk materials such as bulk ZnO and $TiO_2$. As is set out above, bulk ZnO generally provides improved characteristics for optoelectronic devices over $TiO_2$. Using a layer of ZnO nanorods as the electron injecting layer (in particular nanorods having a length around 110 nm) improves the performance of optoelectronic devices still further:

1. In particular, a layer of ZnO nanorods of length 110 nm improves electron injection by around three orders of magnitude over an equivalent electron only device (i.e. capped with hold blocking layers) having a layer of bulk ZnO.

2. ZnO nanorods can be grown at low temperatures (around 90° C.) making them particularly suited for use with semiconducting polymers.

3. Devices using a ZnO nanorod electron injecting layer can operate at a reduced voltage as compared to bulk ZnO.

This is a result of the field enhancement properties of the nanorods and the reduced electron injection barrier to the polymer emissive layer (e.g. F8BT). The open structure of the ZnO nanorods allows the polymer layer to infiltrate the nanorods, increasing the size of the recombination zone and allowing improved electron injection into the polymer layer.

Photonic Structures

The photonic structure associated with the metal oxide layers can be exploited to enhance the electroluminescence efficiency, by reducing losses through absorption by the metal electrodes, and also the optical out-coupling. This can be done by two means: stimulated emission, either by optical pumping or by lasing; and waveguiding in order to direct emission out of the structure.

FIG. 7 shows estimates of EM mode intensity through a range of devices of the type described above. FIG. 7a shows a device as described in Bolink et al, for comparison with the other data in FIG. 7. In this device the peak mode intensity lies in the ITO layer. In contrast, in the devices illustrated in FIGS. 7b, 7c, and 7d, the peak mode intensity is progressively moved away from the $MoO_3$ layer towards the F8BT layer. This is achieved by a number of mechanisms that will be described below. By having the peak mode intensity in or near the emissive material the stimulation cross-section can be increased and the confinement factor can be increased, enhancing the prospect of waveguiding and/or stimulated emission. In general, such a property is promoted by having (a) a central portion of the device that comprises the emissive region and optionally one or more other layers, the components of the central portion having relatively high refractive indices, and (b) outer portions of the device on either side of the central portion that perform charge injection and have relatively low refractive indices.

First, in many conventional devices the proximity of a metallic electrode to the emissive layer allows the metallic electrode to quench the field of any guided mode. Loss from a metal electrode (e.g. of gold) formed on top of the $MoO_3$ layer can be inhibited by using a layer to space the emissive layer from such a metal layer. In preferred devices of FIGS. 7b, c and d a layer of TFB is used to this effect. Layers of other non-metallic transport materials could be used instead of TFB. Preferably, such materials have a work function that allows them to inject the appropriate charge carriers into the emissive material, and have a lower refractive index than the emissive material.

Figure 7A:
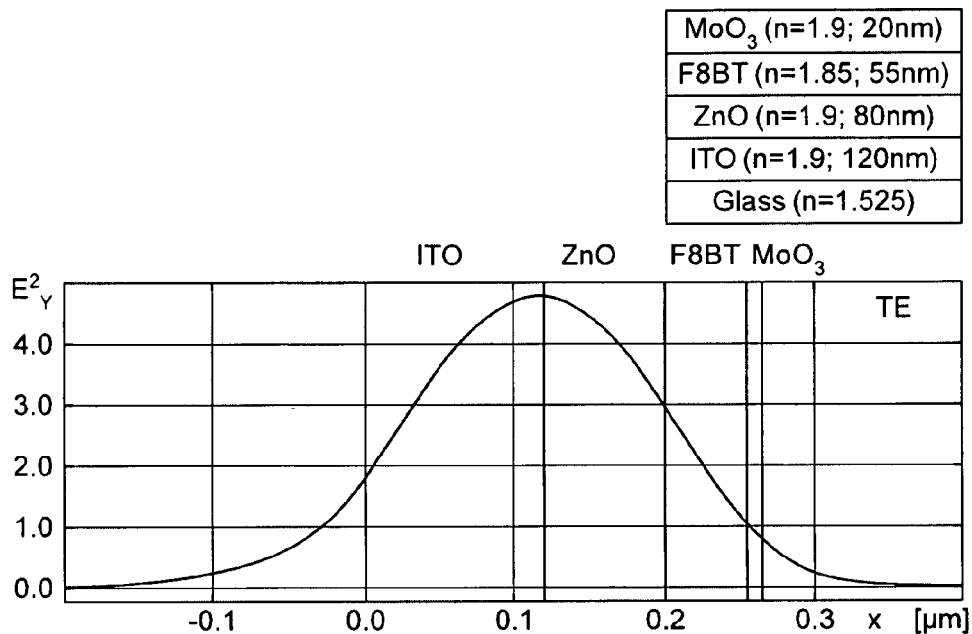
FIG. 7 shows plots of estimated mode intensity through a range of devices including devices of the type described above. The estimates were modelled using ray matrix formulation. The device of FIG. 7a is as described in Bolink et al. Appl. Phys. Letts. 91, 223501 (2007). The other devices of FIG. 7 are devices as described below and having layer thickness as indicated in the respective figures.
Figure 7B:
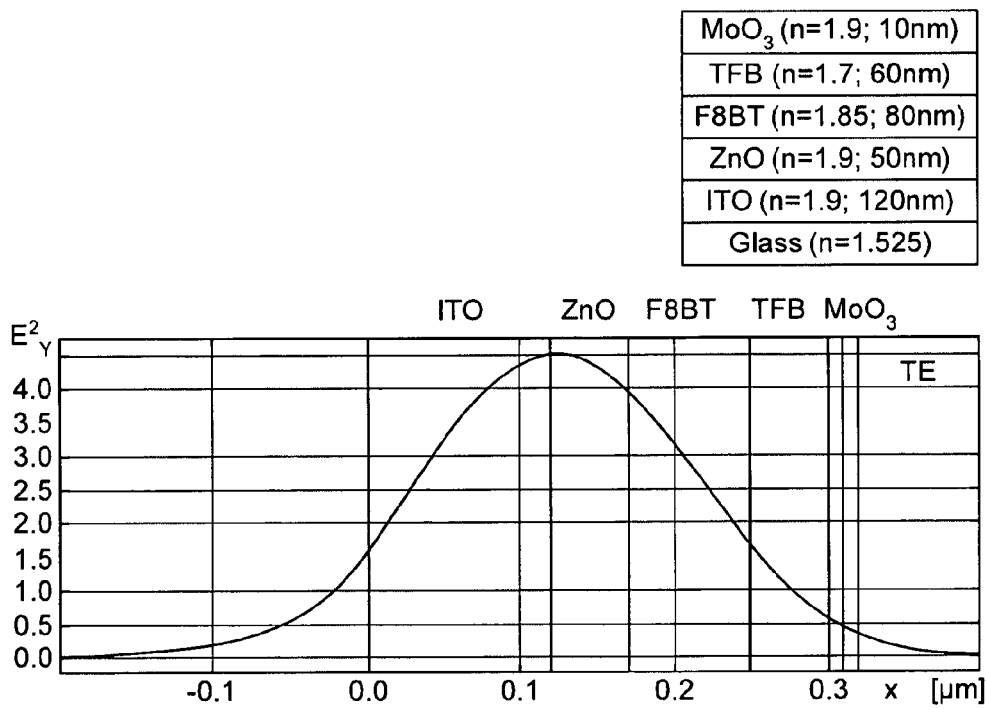
Figure 7C:
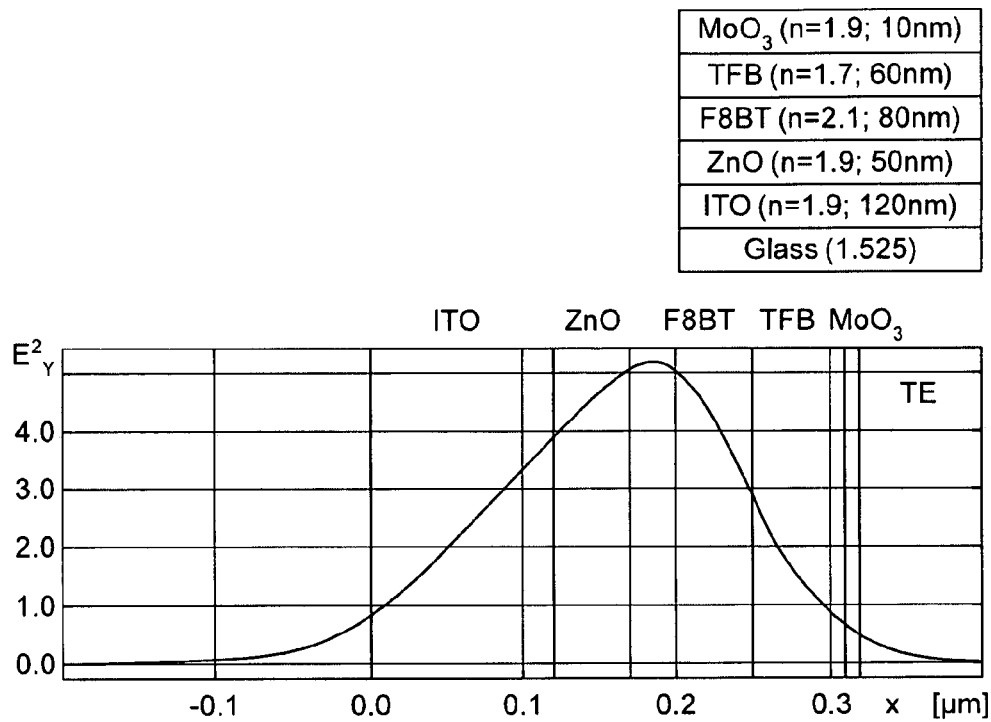

Second, confinement can be enhanced by increasing the effective refractive index of the emissive layer. Taking F8BT as an example, if it is deposited in an orientated fashion it can exhibit anisotropy of refractive index, typically from a value of 1.6 in one direction to a value of 2.1 in a perpendicular direction. By depositing the emissive layer in an aligned fashion, for example by depositing it onto a surface that has surface features that encourage alignment (e.g. as a result of rubbing or by means of a grating) the emissive material can be deposited so as to have a relatively high refractive index in the thickness of the device. In the case of a material that has a liquid crystalline phase, long range order can be obtained even under a relatively weak ordering force, for example by means of nano-imprinting on the surface on which it is to be deposited. As an example of the effectiveness of this mechanism, FIG. 7c illustrates characteristics of a device in which the F8BT layer has a refractive index of 2.1.

Figure 7D:
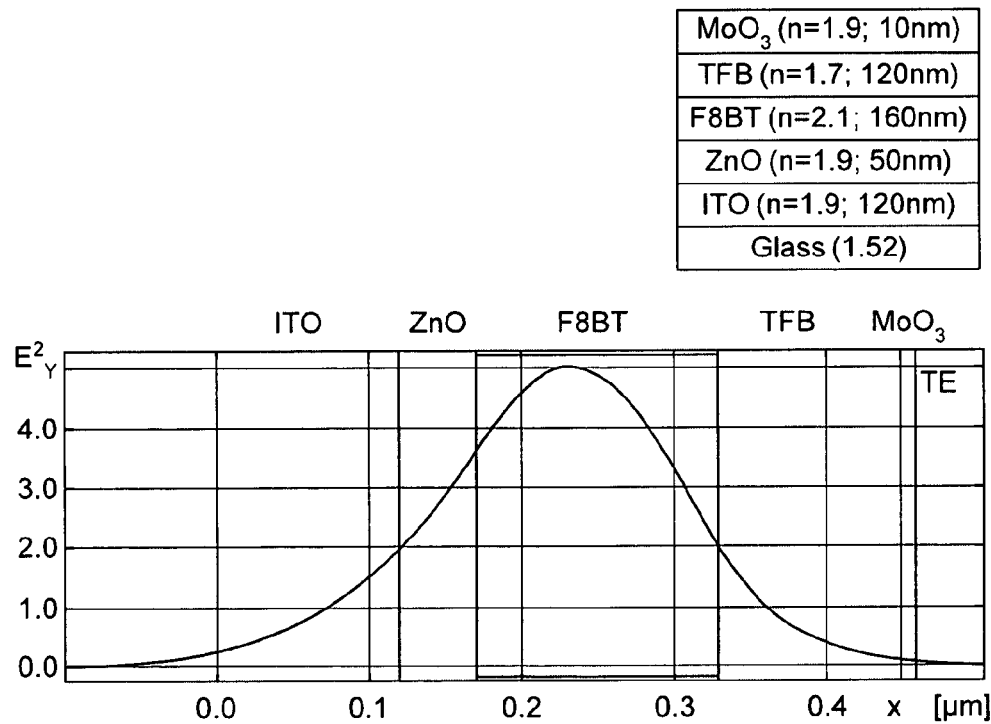

Third, the thicknesses of the layers can be selected to cause the peak mode intensity to lie at a desired location in the device. For example, FIG. 7d illustrates the characteristics of a device having the same components as the device of FIG. 7c, but in which the thicknesses of the emissive (F8BT) and polymeric charge transport (TFB) layers have been altered to enhance confinement in the emissive layer.

Figure 7E:
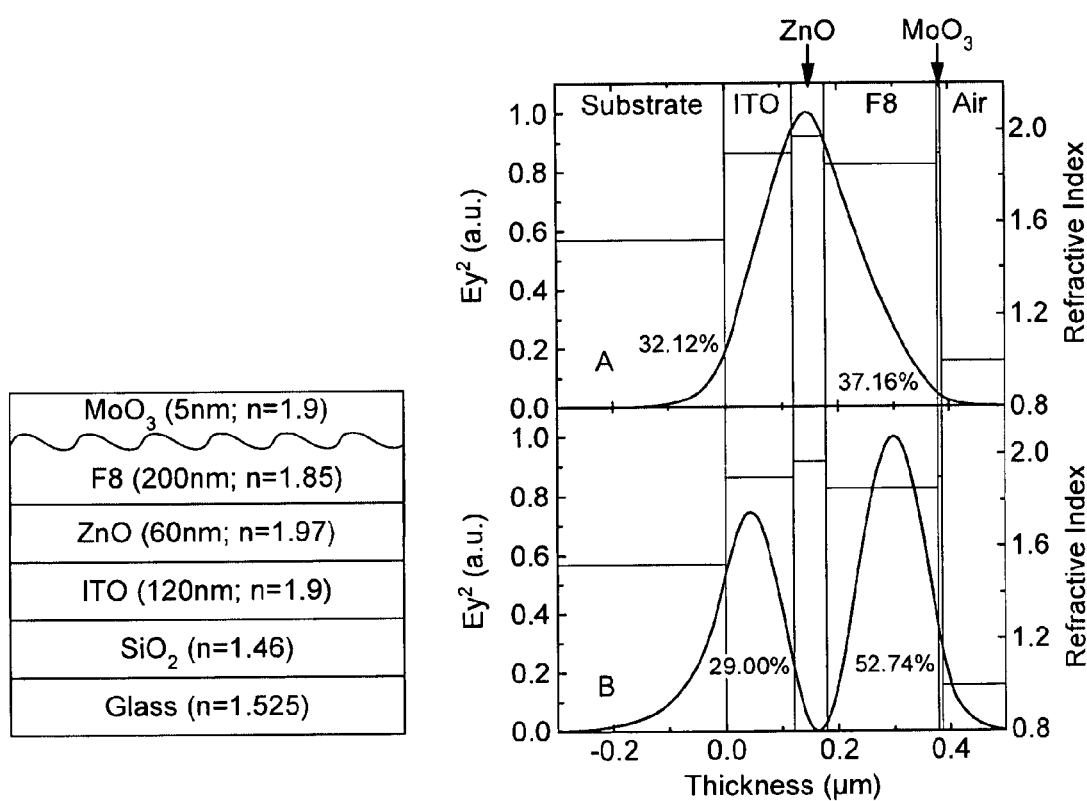

Photonic effects may be enhanced by configuring the device such that the peak mode intensity is in the emissive region, or such that the peak mode intensity lies at the interface between one of the charge injecting components and the emissive region. In the present devices, it is believed that the intensity of the $TE_1$ mode should be considered for optimisation of this parameter. For example, the device of FIG. 7c could be adapted by adjustment of the thicknesses of the layers to cause the peak to lie on the interface between the ZnO electron injecting layer and the F8BT emissive layer. In this latter case, the effect may be further enhance by providing a correlated structure at the appropriate interface. We note that at present we do not have a suitable excitation source for investigating F8BT lasers, though we are in the process of setting up a system for this purpose. We used F8 as an active material which was excited using the $3^{rd}$ harmonic (355 nm) of a Nd:YAG laser. The maximum of the $TE_1$ mode is confined in the F8 active layer, whereas the maximum mode intensity of $TE_0$ mode is located in ZnO layer due to the high refractive index of ZnO. Thus, the $TE_1$ mode is likely to be the lasing mode in our COPLED structures, as shown in FIG. 7e.

Figure 10:
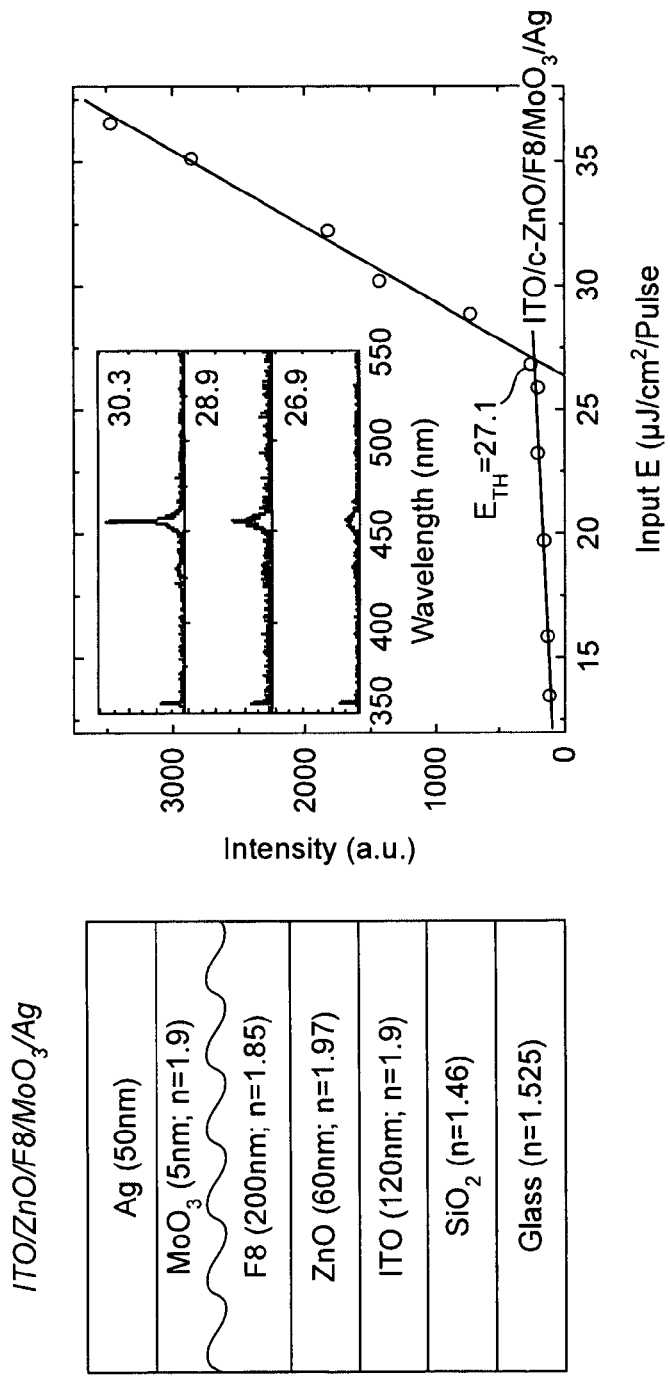

In a device that exhibits waveguiding in the plane of layers in the device it may be advantageous to additionally provide means to direct light out of the plane of the device. This can be done by impressing a grating structure at one of the interfaces in the device, for example at the $MoO_3$/F8 interface, as illustrated in FIG. 10. In other devices it may be desirable for the devices to direct light out of the plane of the substrate. This can be done by curving the waveguides to direct emitted light out of the plane of the substrate, or by introducing light-scattering structures at the ends of the devices.

Whilst in the devices described above each layer may essentially consist of a single material, in other practical devices components (of layer or other forms) could include other inert or active materials. Instead of one or two polymer layers, as discussed above, similar devices could have three or more polymer layers, which could perform charge transport (of holes and/or electrons) and/or emission. Components could be provided as discrete materials, or by components of a single material, for instance as discrete blocks of a block copolymer.

Alternatives to $MoO_3$ include but are not limited to hafnium and vanadium oxides. Alternatives to ZnO and $TiO_2$ include but are not limited to chromium oxide, tin oxide and tungsten oxide.

Figure 8:
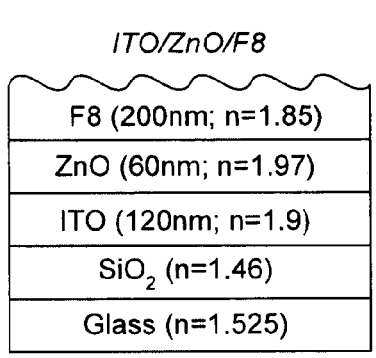
FIGS. 8 to 10 show threshold behavior in polymer DFB lasers with (FIG. 8) ITO/ZnO/F8 ($E_{th}$ 19.1 µJcm$^{-2}$pulse$^{-1}$), (FIG. 9) ITO/ZnO/F8/MoO$_3$ ($E_{th}$=19.1 µJcm$^{-2}$pulse$^{-1}$), and (FIG. 10) ITO/ZnO/F8//MoO$_3$/Ag ($E_{th}$=27.1 µJcm$^{-2}$pulse$^{-1}$) structures respectively. A sequence of emission spectra below (($E_{th}$×1)) and above the threshold (($E_{th}$×x2) and ($E_{th}$×x3)) values for (FIG. 8) ITO/ZnO/F8, (FIG. 9) ITO/ZnO/F8/MoO$_3$, (FIG. 10) ITO/ZnO/F8/MoO$_3$/Ag structures, illustrating the difference in lasing wavelength caused by different effective refractive indices ($n_{eff}$) of the composites with FWHM (full width at half maximum) of 1.1 nm.
Figure 8:
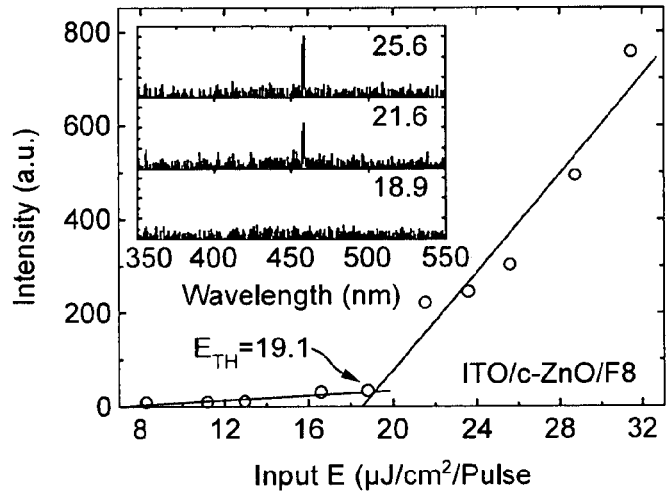
Figure 9:
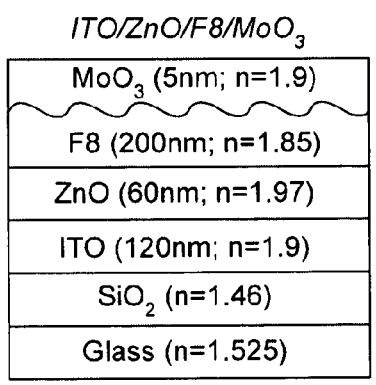
Figure 9:
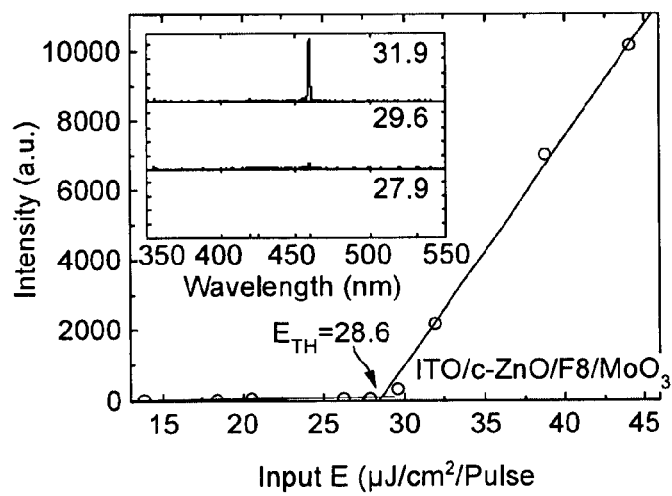

FIGS. 8 to 10 illustrate the results of devices that showed optically pumped lasing. These results were obtained by analyzing the optical output of devices whose structures were as illustrated in the respective figure, stimulated by optical laser light. In each case the stimulation was by a pulse laser (pulse width=500 ps and pumping wavelength: 355 nm) The samples were excited though the polymer side of the device since the ITO-ZnO side of the devices absorbed the stimulating. In all these structure active material was patterned in distributed feedback form to get enhanced outcoupling effect from the plane of diode.

Threshold behavior in polymer DFB lasers with (FIG. 8) ITO/ZnO/F8 ($E_{th}$=19.1 $\mu Jcm^{-2}pulse^{-1}$), (FIG. 9) ITO/ZnO/F8/$MoO_3$ ($E_{th}$=19.1 $\mu Jcm^{-2}pulse^{-1}$), and (FIG. 10) ITO/ZnO/F8/MoO3/Ag ($E_{th}$=27.1 $\mu Jcm^{-2}pulse^{-1}$) structures respectively. A sequence of emission spectra below (($E_{th}$/x1)) and above the threshold (($E_{th}$×x2) and ($E_{th}$×x3)) values for (FIG. 8) ITO/ZnO/F8, (FIG. 9) ITO/ZnO/F8/$MoO_3$, (FIG. 10) ITO/ZnO/F8/MoO3/Ag structures, illustrating the difference in lasing wavelength caused by different effective refractive indices ($n_{eff}$) of the composites with FWHM of 1.1 nm. The input excitation energy was calibrated with a correction factor for the transmission of each substrate because the transmission is 93.5% in 5 nm-thick $MoO_3$, and 33% in 120 nm-thick ITO/60 nm-thick ZnO substrate at 355 nm.

The devices described above have relatively minimal structures. The devices could include more layers or structures to enhance performance. For example, the device of FIG. 10 could be further enhanced by including one or more charge transport and optical spacing layers of one or more low refractive index materials (e.g. TFB) between the emissive layer and one of the metal oxide layers. Such a transport and spacing layer could space the emissive layer from the respective oxide layer, thereby reducing the optical field amplitude at the oxide layer, and reducing optical quenching by the neighboring electrode. As another example, reflective layers could be included at the top and bottom of the device to enhance the device's edge emission.

Figure 11:
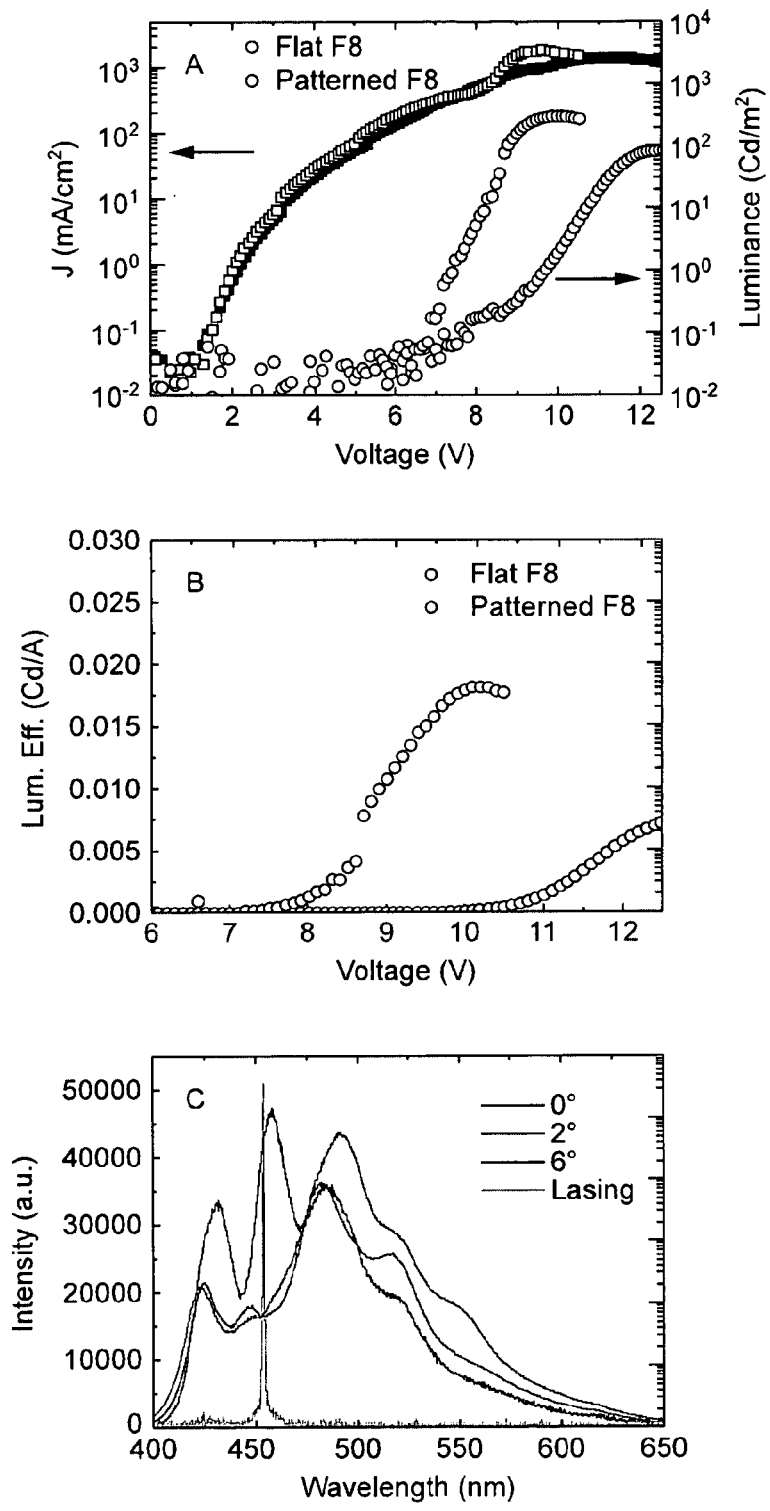
FIG. 11 shows the electroluminescent properties comparing a corrugated DFB composite oxide polymer laser with a flat DFB composite oxide polymer light emitting diode (COPLED); (a) Current density vs voltage (J-V) (filled squares) and luminescence vs voltage (L-V) (open circles) characteristics. (b) Luminescence efficiency vs voltage for COPLED structures incorporating flat F8 (black) and corrugated F8 (red) emissive layers. (c) Angular dependence of electroluminescence spectra from COPLEDs incorporating patterned F8. The lasing spectrum measured on an identical "corrugated" device structure (green line) is also shown

As designed, these devices also operate as LEDs. FIG. 11 shows the current-voltage-luminance (J-V-L) and luminescence efficiency curves for COPLED structures incorporating flat F8 (black) and corrugated F8 (red) films. In these devices, the active layer of F8 was 200 nm thick and the ZnO was 60 nm thick, similar to the devices used for the lasing experiments. Firstly, the same device structures that exhibit optical lasing also exhibit electro-luminescence, and we note that this represents a significant step towards polymer injection lasers. J-V curves show that introducing DFB pattern to the F8 enhances the luminance and luminescence efficiency vs voltage for these COPLED structures, while turn-on voltages (~6.0V) and current densities remain almost identical. Here, the luminescence efficiency value (0.0181 Cd/A) is relatively low as compared to our optimized COPLEDs incorporating F8BT (green emitter) which can reach 3 Cd/A (23). This is as expected for a single-semiconductor polymer layer LED. The out-coupling effect was confirmed from angular dependent measurement of electroluminescence spectra in COPLED structures incorporating the corrugated F8 films, as shown in FIG. 11 (c). Emission in the forward direction has a maximum peak at 458 nm, however this peak disappears at any angle other than 0°. This peak coincides remarkably well with the lasing wavelength illustrating that the same structure which induced the distributed feedback in the laser enhances the electroluminescent out-coupling in the LED. For COPLEDs incorporating the flat F8 film we observe no sudden change in the emission spectra moving away from the position.

The demonstration of optically-pumped lasing in the structures shown in FIGS. 8-10 is clear evidence that optical losses associated with absorption by the metallic electrodes has been substantially reduced, through the engineering of the in-plane wave-guided mode away from these electrodes. This property is widely useful for many other device structures:

(i) Improved efficiency of light-emitting diodes. It is generally established that direct out-coupling of emitted light in organic semiconductor LEDs in the forward direction is of order 25%, with the remaining light being coupled into internal modes. These are absorbed in traditional device architectures because their propagation within the device is quickly attenuated. Particularly in combination with out-coupling structures such as the DFB structures used here, substantially improved out-coupling efficiency can be achieved using the improved structures presented here.

(ii) Improved efficiency photovoltaic cells. The same optical structures that give efficient light emission are also desirable for reverse process: light absorption within the device to give photovoltaic diode operation. Photovoltaic operation is shown to be widely observed in diodes comprising polymeric or molecular semiconductors, as shown in FIG. 5(b). The selection of semiconductor materials requires that they first absorb light and subsequently all separation of electron from hole to allow charge collection at the electrodes, and it is generally found that combinations of electron-accepting and hole-accepting materials are needed. One preferred choice is of blends of such materials deposited as a single film from common solvent [see, for example, U.S. Pat. No. 5,670,791, J. J. H. Halls and R. H. Friend and Conjugated Polymer-Based Organic Solar Cells, Gunes et al., Chem. Rev., 107, 1324-1338]. Such materials combinations can be used in the improved photonic structures exemplified here (FIGS. 8-10) for optically-pumped lasing. Suitable hole-accepting materials include p-type metal oxides, such as $MoO_3$, $WO_3$, $V_2O_5$ which can be thermally evaporated along with a top reflecting metal electrode.

Figure 15:
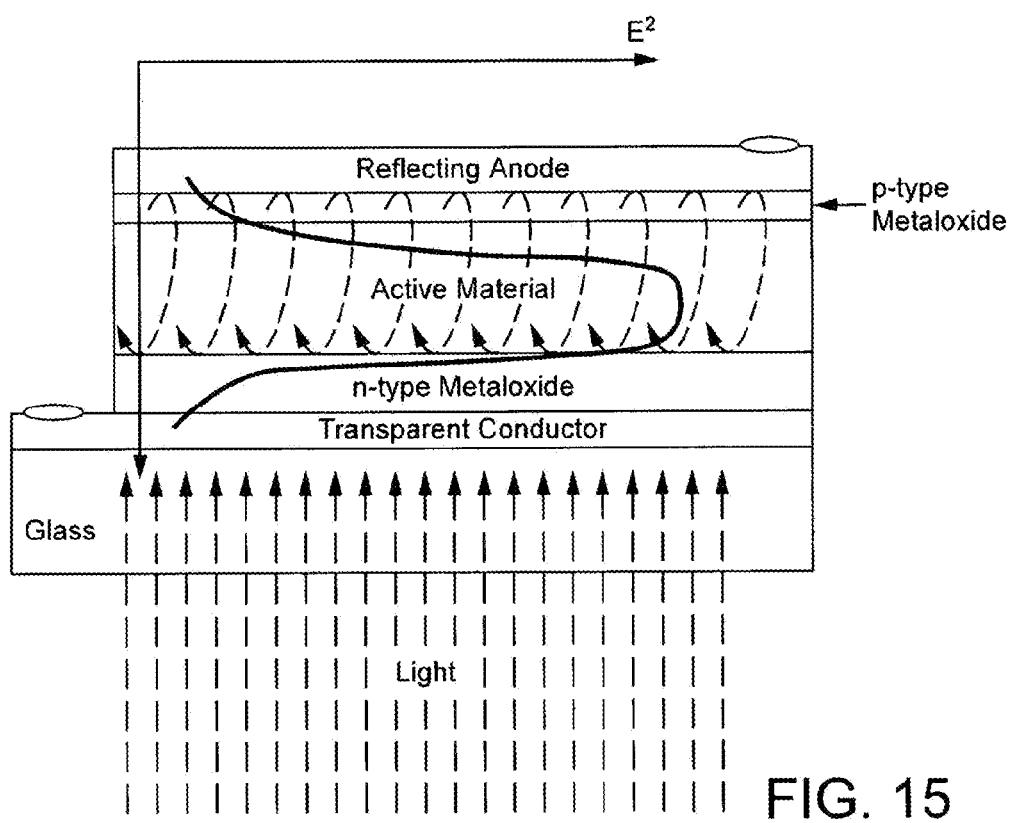
FIG. 15 is a schematic diagram of a composite oxide polymer solar cell (COPSC) structure exhibiting enhanced light coupling in the active layer.

Thus, it is advantageous for photovoltaic cells to use the principles described above in relation to FIGS. 7a to 7e so as to achieve enhanced light coupling through appropriate selection of the refractive indices and thicknesses of the layers of the device. For example, preferably the layers either side of the active emissive layer (e.g. F8TB) have a lower refractive index than the active layer. The application of these principles results in an energy density curve in a composite oxide polymer solar cell (COPSC) structure as shown in FIG. 15, with the highest density concentrated in the active layer which enhances optical absorption and hence the number of photo-generated charge carriers.

Figure 16:
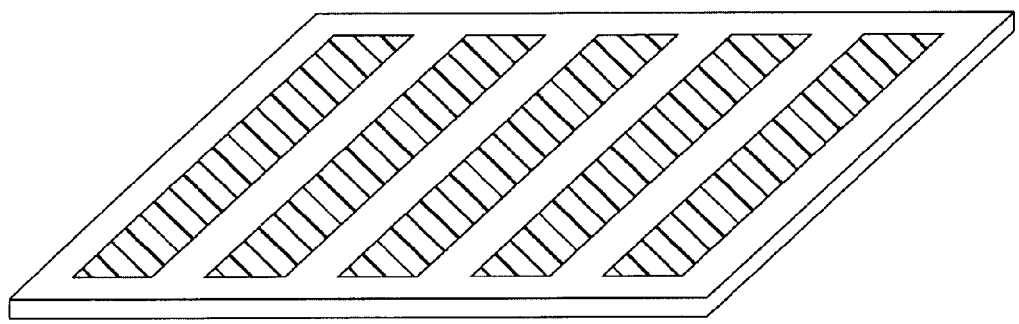
FIG. 16 is a schematic diagram of a solar panel array in perspective and cross-section views.
Figure 16:
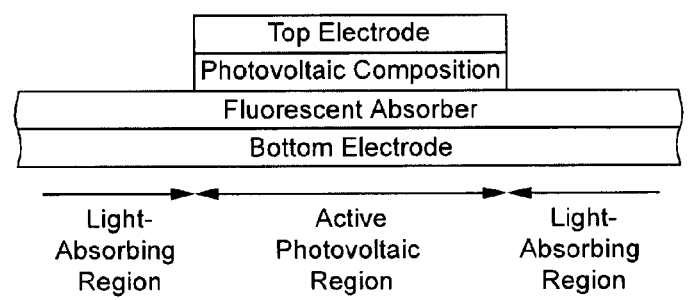

The low optical waveguide losses can also allow the design of a photovoltaic device in which light is absorbed in a region to one side of the active photovoltaic composition and is then wave-guided within the plane of the device to the active photovoltaic region. Such a structure is advantageous when it allows light capture in areas of the photovoltaic device system which cannot be used directly as photovoltaic diodes, for example in the regions between adjacent photovoltaic cells as arranged to form a photovoltaic panel. Through the use of the waveguiding principles of the present invention, light falling on the light-absorbing regions shown in FIG. 16 is directed into the active photovoltaic region. This increases the effective efficiency of the solar panel array. Such a structure is shown in FIG. 16.

Figure 17:
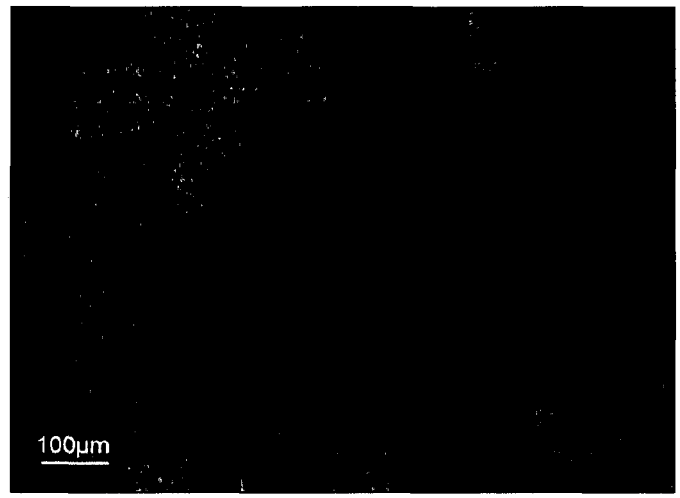
FIG. 17 shows two optical images of a COPLED: (a) is an optical microscopy image of a COPLED incorporating patterned ZnO nanorods with no current flowing; (b) is an optical image of the electro luminescence from the same patterned ZnO nanorod-based device.
Figure 17:
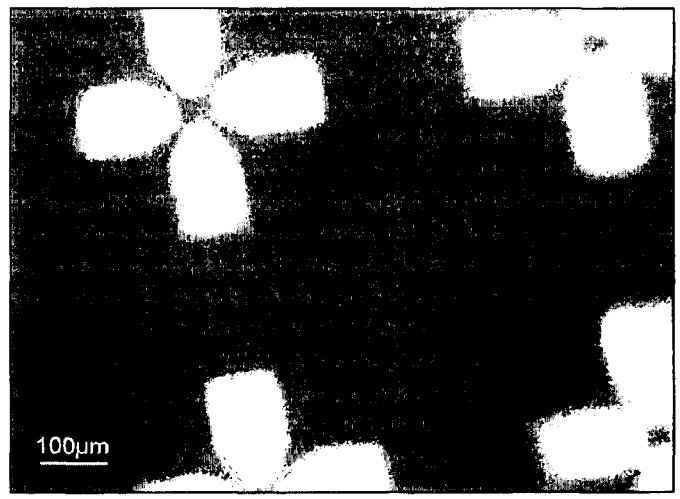

Further to physically structuring the emissive or absorbing polymer layer to improve light coupling, the electron injection layers can also be structured. An example of this is shown in FIG. 17 where (a) shows an optical microscopy image of a COPLED incorporating patterned ZnO nanorods with no current flowing, and (b) shows an optical image of the electro luminescence from the same patterned ZnO nanorod-based device.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A diode device comprising:
   a first electrode;
   a second electrode;
   an organic light emissive or responsive component comprising a molecular semiconductor material located between the first electrode and the second electrode;
   a first charge transport layer located between the first electrode and the organic light emissive or responsive layer for transporting charge between that electrode and the organic light emissive or responsive layer; and
   a second charge transport layer located between the second electrode and the organic light emissive or responsive layer for transporting charge between that electrode and the organic light emissive or responsive layer,
   wherein the organic light emissive or responsive layer is adapted to be in an oriented state providing an anisotropic refractive index such that the organic light emissive or responsive layer has a higher refractive index in a given direction than the first and second charge transport layers.

2. A diode device as claimed in claim 1, comprising a further charge transport layer located between the first charge transport layer and the organic light emissive or responsive layer, and optionally a further charge transport layer located between the second charge transport layer and the organic light emissive or responsive layer.

3. A diode device as claimed in claim 1, wherein the first and/or second charge transport layer comprises ZnO or $TiO_2$ or $MoO_3$ or ZnO nanorods.

4. A diode device as claimed in claim 1, wherein the first and/or second charge transport layers have a refractive index greater than 1.85.

5. A diode device as claimed in claim 2, wherein the further charge transport layer comprises an organic material.

6. A diode device as claimed in claim 2, wherein the further charge transport layer has a refractive index of less than 1.85.

7. A diode device as claimed in claim 2, wherein the further charge transport layer comprises poly(2,7-(9,9-di-n-octylfluorene)-alt-(1,4-phenylene((4-sec-butylphenyl)imino)-1,4-phenylene)) (TFB).

8. A diode device as claimed in claim 1, wherein the organic light emissive or responsive layer has luminescent characteristics capable of supporting lasing by the device and the device is a laser device.

9. A diode device as claimed in claim 1, wherein the organic light emissive or responsive layer comprises a material capable of effecting charge separation of charge carriers due to photo absorption and the device is a photovoltaic device.

10. A diode device as claimed in claim 9, wherein the structure of the device is such that at least some of the light not incident on the organic light responsive layer is directed into the organic light responsive layer.

11. A diode device as claimed in claim 1, comprising means for enhancing optical out-coupling from the device.

12. A diode device as claimed in claim 11, wherein the means for enhancing optical out-coupling from the device comprises a distributed feedback structure.

13. A diode device as claimed in claim 11, wherein the means for enhancing optical out-coupling from the device comprises a grating.

14. A diode device as claimed in claim 13, wherein the grating is at the interface between two layers of the device.

15. A diode device as claimed in claim 14, wherein the said two layers are located between the electrodes.

16. A diode device as claimed in claim 1, wherein the device is an edge emissive device.

17. A diode device as claimed in claim 1, wherein greater than 25% of emission from the device is from the edge of the device.

18. A diode device as claimed in claim 1, wherein the light emissive or responsive layer has a lower refractive index in a direction perpendicular to a major plane of the layer than it does in that plane.

19. A diode device as claimed in claim 13, wherein the metal oxide is a layer of ZnO nanorods and the nanorods are predominantly oriented perpendicularly to a major plane of that layer.

20. A diode device as claimed in claim 19, wherein the nanorods are less than 400 nm in length.

* * * * *